(12) United States Patent
Dickey et al.

(10) Patent No.: US 8,950,266 B2
(45) Date of Patent: Feb. 10, 2015

(54) REVERSIBLY DEFORMABLE AND MECHANICALLY TUNABLE FLUIDIC ANTENNAS

(71) Applicant: North Carolina State University, Raleigh, NC (US)

(72) Inventors: Michael David Dickey, Raleigh, NC (US); Gianluca Lazzi, Salt Lake City, UT (US); Ju-Hee So, Cary, NC (US); Jacob Thelen, Raleigh, NC (US); Amit Qusba, Raleigh, NC (US); Gerard James Hayes, Wake Forest, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 14/079,598

(22) Filed: Nov. 13, 2013

(65) Prior Publication Data

US 2014/0137657 A1    May 22, 2014

Related U.S. Application Data

(62) Division of application No. 12/889,257, filed on Sep. 23, 2010, now Pat. No. 8,587,493.

(51) Int. Cl.
| | |
|---|---|
| G01L 1/00 | (2006.01) |
| G01L 1/10 | (2006.01) |
| G01B 7/16 | (2006.01) |
| G01L 1/20 | (2006.01) |
| H01Q 1/36 | (2006.01) |
| H01Q 9/20 | (2006.01) |

(52) U.S. Cl.
CPC .............. *G01L 1/205* (2013.01); *H01Q 1/364* (2013.01); *H01Q 9/20* (2013.01)

USPC ................ 73/763; 73/769; 73/773; 73/774; 73/862.59

(58) Field of Classification Search
USPC ............. 73/862.59, 579, 773, 774, 763, 769, 73/778, 779, 780; 343/723, 724
See application file for complete search history.

(56) References Cited

U.S. PATENT DOCUMENTS

| | | | | |
|---|---|---|---|---|
| 2,278,601 | A * | 4/1942 | Werndl | 343/723 |
| 5,563,348 | A * | 10/1996 | Suzuki et al. | 73/800 |
| 6,859,189 | B1 * | 2/2005 | Ramirez et al. | 343/815 |
| 6,906,680 | B2 | 6/2005 | Rawnick et al. | |
| 6,927,745 | B2 * | 8/2005 | Brown et al. | 343/909 |
| 6,967,628 | B2 * | 11/2005 | Rawnick et al. | 343/793 |
| 6,992,628 | B2 | 1/2006 | Rawnick et al. | |

(Continued)

OTHER PUBLICATIONS

Notice of Allowance and Fee(s) Due for U.S. Appl. No. 12/889,257 (Jul. 19, 2013).

(Continued)

*Primary Examiner* — Lisa Caputo
*Assistant Examiner* — Jonathan Dunlap
(74) *Attorney, Agent, or Firm* — Jenkins, Wilson, Taylor & Hunt, P.A.

(57) ABSTRACT

A method of manufacturing a fluidic structure is disclosed. A cavity that defines a shape of an element of the fluidic structure within a material is formed. The cavity is filled with liquid metal. The cavity is sealed. The fluidic structure behaves as an antenna. A fluidic antenna includes a material that defines a shape of the fluidic antenna by a cavity filled with liquid metal formed within the material, where the material further defines at least one mechanical property of the fluidic antenna.

6 Claims, 11 Drawing Sheets

(56) References Cited

U.S. PATENT DOCUMENTS

| | | | |
|---|---|---|---|
| 7,023,384 | B2 | 4/2006 | Brown et al. |
| 7,084,828 | B2 | 8/2006 | Rawnick et al. |
| 7,969,370 | B1* | 6/2011 | Dinh et al. ............... 343/720 |
| 8,350,770 | B1 | 1/2013 | Dawson |
| 8,487,822 | B1* | 7/2013 | Jennings ................ 343/745 |
| 8,587,493 | B2 | 11/2013 | Dickey et al. |
| 2007/0132656 | A1* | 6/2007 | Kim et al. ............... 343/895 |
| 2010/0095762 | A1* | 4/2010 | Despesse ................ 73/290 V |
| 2012/0075069 | A1 | 3/2012 | Dickey et al. |

OTHER PUBLICATIONS

Commonly-assigned, co-pending U.S. Appl. No. 61/831,597 for "Methods, Systems, and Computer Readable Media for Voltage Controlled Reconfiguration of Liquid Metal Structures," filed Jun. 5, 2013, unpublished.

Restriction and/or Election Requirement for U.S. Appl. No. 12/889,257 (Mar. 26, 2013).

Adam C. Siegel, et al., Microsolidics: Fabrication of Three-Dimensional Metallic Microstructures in Poly (dimethylsiloxane), Journal: Advanced Materials, 2007, pp. 727-733, vol. 19, Wiley-VCH Verlag GmbH & Co. KGaA, Weinheim, Germany.

Benoit Huyghe, et al., Design and Manufacturing of Stretchable High-Frequency Interconnects, Journal: IEEE Transactions on Advanced Packaging, Nov. 2008, vol. 31, No. 4, pp. 802-808, IEEE Xplore, Published on the World Wide Web.

C. M. Kuo, et al., Plastic deformation mechanism of pure copper at low homologous temperatures, Journal: Materials Science and Engineering A, 2005, pp. 360-368, Elsevier BY, Published on the World Wide Web.

Chang-Wook Baek, et al., A V-Band Micromachined 2-D Beam-Steering Antenna Driven by Magnetic Force With Polymer-Based Hinges, Journal: IEEE Transactions on Microwave Theory and Techniques, Jan. 2003, vol. 51, No. 1, pp. 325-331, IEEE Xplore, Published on the World Wide Web.

D. Zrnic, et al., Short Communications: On the resistivity and surface tension of the eutectic alloy of gallium and indium, Journal of the Less-Common Metals, 1969, pp. 67-68, vol. 18, Elsevier Sequoia SA, The Netherlands.

Dahl-Young Khang, et al., A Stretchable Form of Single-Crystal Silicon for High-Performance Electronics on Rubber Substrates, Magazine: Science, Jan. 2006, vol. 311, pp. 208-212, American Association for the Advancement of Science, Washington, DC, USA.

Darren S. Gray, et al., High-Conductivity Elastomeric Electronics, Journal: Advanced Materials, Mar. 2004, pp. 393-397, vol. 16, No. 5, Wiley-VCH Verlag GmbH & Co. KGaA, Weinheim, Germany.

Dominique Brosteaux, et al., Design and Fabrication of Elastic Interconnections for Stretchable Electronic Circuits, Journal: IEEE Electron Device Letters, Jul. 2007, pp. 552-554, vol. 28, No. 7, IEEE Xplore, Published on the World Wide Web.

F. Zhang, et al., Conducting and transparent polymer electrodes, SciFinder Review/Abstract from Chapter of Textbook Optical Science and Engineering, Textbook date: 2005, Review date: 2010, Textbook pp. 479-494, vol. 99, Textbook Publisher: CRC Press LLC, Sweden, SciFinder Review Publisher: American Chemical Society.

G. Dejean, et al., Liquid Crystal Polymer (LCP): A New Organic Material for the Development of Multilayer Dual-Frequency/Dual-Polarization Flexible Antenna Arrays, Journal: IEEE Antennas and Wireless Propagation Letters, 2005, pp. 22-26, vol. 4, IEEE Xplore, Published on the World Wide Web.

Hyun-Joong Kim, et al., A multiaxial stretchable interconnect using liquid-alloy-filled elastomeric microchannels, Journal: Applied Physic Letters 92,011904, Jan. 2008, pp. 1-3, American Institute of Physics, Published on the World Wide Web.

J. C. Langer, et al., Micromachined Reconfigurable Out-of-Plane Microstrip Patch Antenna Using Plastic Deformation Magnetic Actuation, Journal: IEEE Microwave and Wireless Components Letters, Mar. 2003, pp. 120-122, vol. 13, No. 3, IEEE Xplore, Published on the World Wide Web.

J. C. Lotters, et al. The mechanical properties of the rubber elastic polymer polydimethylsiloxane for sensor applications, Journal of Micromechanics and Microengineering, Apr. 1997, pp. 145-147, vol. 7, IOP Publishing Ltd., Published on the World Wide Web.

J. Cooper McDonald, et al., Fabrication of microfluidic systems in poly(dimethylsiloxand), Journal: Electrophoresis, 2000, pp. 27-40, vol. 21, Wiley-VCH Verlag GmbH, Weinheim, Germany.

Joe Unsworth, et al., Conducting Polymers: Properties and Applications, Journal of Intelligent Material Systems and Structures, Sep. 1994, pp. 595-604, vol. 5, Technomic Publishing Co., Inc., Published on the World Wide Web by Sage Publications.

Ju-Hee So, et al., Reversibly Deformable and Mechanically Tunable Fluidic Antennas, Journal: Advanced Functional Materials, 2009, pp. 1-6, vol. 19, Wiley-VCH Verlag GmbH & Co. KGaA, Weinheim, Germany.

Kyung M. Choi, et al., A Photocurable Poly(dimethylsiloxane) Chemistry Designed for Soft Lithographic Molding and Printing in the Nanometer Regime, Journal: American Chemical Society, 2003, pp. 4060-4061, vol. 125, No. 14, American Chemical Society, Published on the World Wide Web.

M. J. Regan, et al., X-ray reflectivity studies of liquid metal and alloy surfaces, Journal: Physical Review B, Jun. 1997, pp. 874-884, vol. 55, No. 23, The American Physical Society, Published on the World Wide Web.

M. J. Regan, et al., X-ray study of the oxidation of liquid-gallium surfaces, Journal: Physical Review B, Apr. 1997, pp. 786-791 vol. 55, No. 16, The American Physical Society, Published on the World Wide Web.

Mario Gonzalez, et al., Design of metal interconnects for stretchable electronic circuits, Journal: Microelectronics Reliability, Jun. 2008, pp. 825-832, vol. 48, Elsevier Ltd., Published on the World Wide Web.

Masahiro Kubo, et al., Stretchable Microftuidic Radiofrequency Antennas, Journal: Advanced Materials, 2010, pp. 2749-2752, vol. 22, Wiley-VCH Verlag GmbH & Co. KGaA, Weinheim, Germany.

Michael D. Dickey, et al., Eutectic Gallium—Indium (EGaln): A Liquid Metal Alloy for the Formation of Stable Structures in Microchannels at Room Temperature, Journal: Advanced Functional Materials, 2008, pp. 1-8, vol. 18, Wiley-VCH Verlag GmbH & Co. KGaA, Weinheim, Germany.

Michael S. Miller, et al., Fabrication of ElastomericWires by Selective Electroless Metallization of Poly (dimethylsiloxane), Journal: Advanced Materials, 2008, pp. 59-64, vol. 20, Wiley-VCH Verlag GmbH & Co. KGaA, Weinheim, Germany.

Nicolas Tiercelin, et al., Polydimethylsiloxane membranes for millimeter-wave planar ultra flexible antennas, Journal of Micromechanics and Microengineering, Sep. 2006, pp. 2389-2395, vol. 16, IOP Publishing Ltd., Published on the World Wide Web.

R. Morent, et al., Adhesion enhancement by a dielectric barrier discharge of PDMS used for flexible and stretchable electronics, Journal of Physics D: Applied Physics, Nov. 2007, pp. 7392-7401, vol. 40, IOP Publishing Ltd., Published on the World Wide Web.

Ryan C. Chiechi, et al., Eutectic Gallium—Indium (EGaln); A Moldable Liquid Metal for Electrical Characterization of Self-Assembled Monolayers, Journal: Angewandte Chemie Int. Ed., 2007, pp. 1-4, vol. 46, Wiley-VCH Verlag GmbH & Co. KGaA, Weinheim, Germany.

S. Befahy, et al., Stretchable helical gold conductor on silicone rubber microwire, Journal: Applied Physics Letters 91, 141911, Oct. 2007, pp. 1-3, American Institute of Physics, Published on the World Wide Web.

Shi Cheng, et al., Liquid metal stretchable unbalanced loop antenna, Journal: Applied Physics Letters 94,144103, Apr. 2009, pp. 1-3, American Institute of Physics, Published on the World Wide Web.

Shiyong Yang, et al., Preparation and mechanical properties of electrically conductive polypyrrole-poly(ethylene-co-vinyl acetate) composites, Journal: Synthetic Metals, 1993, pp. 249-254, vol. 60, Elsevier Sequoia (Elsevier BY), Published on the World Wide Web in 2003.

(56) References Cited

OTHER PUBLICATIONS

Sidney J. French, et al., The System Gallium—Indium, Paper: Department of Chemistry, Colgate University, Sep. 1937, pp. 1-10, Published on World Wide Web by Americal Chemical Society May 2002.

Stephanie P. Lacour, et al., Mechanisms of reversible stretchability of thin metal films on elastomeric.substrates, Journal: Applied Physics Letters 88, 204103, May 2006, pp. 1-3, American Institute of Physics, Published on the World Wide Web.

Teng L1, et al., Deformability of thin metal films on elastomer substrates, International Journal of Solids and Structures, Jun. 2005, pp. 2351-2363, vol. 43, Elsevier Ltd., Published on the World Wide Web.

Teng L1, et al., Stretchability of thin metal films on elastomer substrates, Journal: Applied Physics Letters, Oct. 2004, pp. 3435-3437, vol. 85, No. 16, American Institute of Physics, Published on the World Wide Web.

Xiangdong Ye, et al., Research on the cast molding process for high quality PDMS molds, Journal: Microelectronic Engineering, Oct. 2008, pp. 310-313, vol. 86, Elsevier BY, Published on the World Wide Web.

Yanyi Huang, et al., Bottom-up soft-lithographic fabrication of three-dimensional multilayer polymer integrated optical microdevices, Journal: Applied Physics Letters, Oct. 2004, pp. 3005-3007, vol. 85, No. 15, American Institute of Physics, Published on the World Wide Web.

Younan Xia, et al., Soft Lithography, Journal: Angewandte Chemie Int. Ed., 1998, pp. 550-575, vol. 37, Wiley-VCH Verlag GmbH, Weinheim, Germany.

Yugang Sun, et al., Inorganic Semiconductors for Flexible Electronics, Journal: Advanced Materials, 2007, pp. 1897-1916, vol. 19, Wiley-VCH Verlag GmbH & Co. KGaA, Weinheim, Germany.

* cited by examiner

US 8,950,266 B2

REVERSIBLY DEFORMABLE AND MECHANICALLY TUNABLE FLUIDIC ANTENNAS

PRIORITY CLAIM

This application is a divisional of U.S. patent application Ser. No. 12/889,257, filed Sep. 23, 2010; the disclosure of which is incorporated herein by reference in its entirety.

BACKGROUND

The present invention relates to antennas. More particularly, the present invention relates to reversibly deformable and mechanically tunable fluidic antennas.

Antennas provide electromagnetic signaling transmission and reception capabilities for electronic devices via emission and reception of electromagnetic radiation, respectively. For transmission, antennas conventionally convert electrical current that carries information into electromagnetic signals that are propagated to other devices. For reception, antennas conventionally convert electromagnetic signals incident upon the antenna into an electrical current that carries received information.

BRIEF SUMMARY

A method of manufacturing a fluidic structure includes forming a cavity that defines a shape of an element of the fluidic structure within a material; filling the cavity with liquid metal; and sealing the cavity, where the fluidic structure behaves as an antenna.

A fluidic antenna includes a material that defines a shape of the fluidic antenna via a cavity formed within the material, where the material further defines at least one mechanical property of the fluidic antenna; and liquid metal that fills the cavity.

A method includes receiving, via a receiving antenna of a computing device, a radio frequency signal transmitted via a fluidic antenna coupled to a structural element, where at least one liquid metal antenna element is formed within a material that defines an elastomeric mechanical property of the fluidic antenna and where spectral transmission characteristics of the fluidic antenna change in response to changes in shape of the fluidic antenna; determining a resonant frequency of the radio frequency signal; and determining a strain on the structural element based upon the determined resonant frequency of the radio frequency signal.

DETAILED DESCRIPTION

Figure 1:
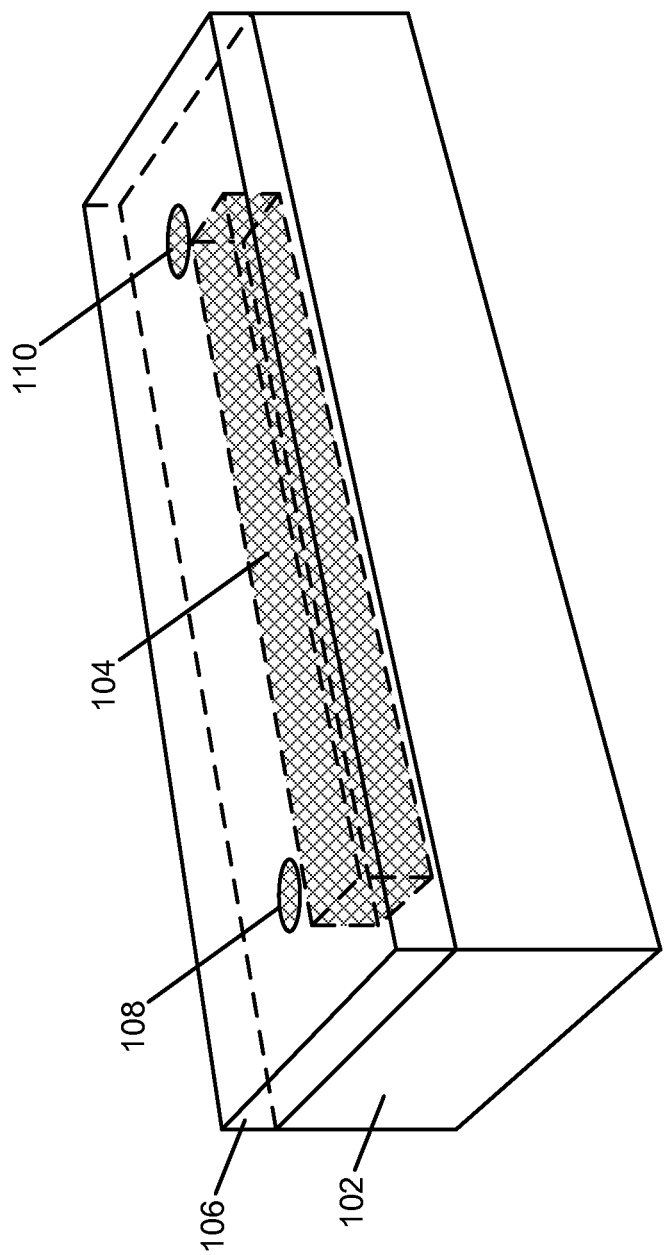
FIG. 1 is an illustration of an example of an implementation of a reversibly deformable and mechanically tunable single element (e.g., single pole) fluidic antenna according to an embodiment of the present subject matter.

The examples set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The subject matter described herein provides reversibly deformable and mechanically tunable fluidic antennas. The reversibly deformable and mechanically tunable fluidic antennas may be formed by injecting a liquid metal, such as gallium or a gallium-based alloy, into one or more cavities within a material substrate or a base material coupled to a bonding layer material. However, it is understood that any liquid metal that has a melting point below an ambient liquid metal antenna manufacturing facility temperature may be used such that heating of the liquid metal is not required. It is understood that any given manufacturing facility may be operated at a different temperature as appropriate for a given implementation. An example temperature range from negative twenty degrees Celsius ($-20°$ C.) to forty degrees Celsius ($40°$ C.) may be used in association with certain of the metals described herein that are in a liquid state within this range, though it is understood that other temperature ranges may be appropriate for any given liquid metal to be used to form a reversibly deformable and mechanically tunable fluidic antenna. For example, eutectic gallium indium (EGaIn) has a melting point of fifteen and seven tenths degrees Celsius (15.7° C.). As such, a lower end of the ambient liquid metal antenna manufacturing facility temperature range for such an implementation may be considered, for example, sixteen degrees Celsius (16° C.). Other metals and temperature ranges may be used for formation of liquid metal antennas that may have higher or lower melting points, and as such, different ambient liquid metal antenna manufacturing facility temperature ranges.

As an alternative to injecting a liquid metal into one or more cavities, the liquid metal may be drawn into a cavity by applying a vacuum or other pulling force to the liquid metal via the cavity. In either implementation, injecting or drawing the liquid metal into the cavity may be terminated in response to the cavity filling to capacity. Alternatively, filling the cavity may be terminated on demand by cessation of the filling process upon filling of the cavity to an extent sufficient to allow radiation of electromagnetic energy via the fluidic antenna. Inlet and outlet filling hole locations may be provided for the respective operations, and the cavity may be sealed in response to filling the cavity.

The term "fluidic antenna" and "liquid metal antenna" may be used interchangeably to represent an antenna with a liquid metal resonant element. The term "material" and "substrate" may be used interchangeably to represent a substance within which a fluidic antenna may be formed. The term "cavity" may be used to represent a hollow channel, capillary, conduit, groove, furrow or other structure within a substrate within which liquid metal may be filled to form a fluidic antenna. The terms "cavity," "channel," and "capillary" or other terms may be used interchangeably hereafter to identify a void or other structure, within one or more portions of material that define a shape of a fluidic antenna within the material, that may be filled with liquid metal to form a fluidic antenna. For certain implementations, a channel may be considered a "microfluidic channel."

The material within which the cavity and fluidic antenna are formed may include a flexible material, for example, an elastomer such as silicone or other polymer-based materials. Other examples of flexible materials include polymer films, composite substrates, gels, thin metal supports, and other flexible materials. The material within which the cavity and fluidic antenna are formed may also include rigid materials such as wood, dry wall, polymeric parts, polymer films, gels, and other rigid materials. It is understood that the present subject matter applies to any material that may form a cavity that may define a shape of a fluidic antenna without interfering with spectral properties of the fluidic antenna beyond interference acceptable within a given implementation, and all such materials are within the scope of the present subject matter.

A cavity may be formed into a substrate in a variety of manners. Because the antenna is formed with a liquid metal, the mechanical properties of the antenna may be defined by mechanical properties of the substrate. As such, for an elastomeric substrate, the resulting elastomeric fluidic antenna may be deformed (e.g., stretched, bent, flexed, rolled, etc.) and released/reversed without loss of electrical continuity. As a consequence, the resulting antennas may be more durable relative to conventional technologies and may be utilized in applications that would otherwise result in destruction of conventional antennas. Strain may be induced in a material, for example, in response to temperature changes, pressure changes, mechanical load changes, geographical changes, or any other change that results in a force on the material that deforms, elongates, shrinks, or otherwise changes the material's dimensions. For example, the fluid metal may flow in response to strain (e.g., elongation) of the elastomeric substrate, resulting in a reconfiguration of the geometry of the fluidic antenna and a resulting shift in the resonant frequency of the antenna, while returning to its original geometry and frequency response upon removal of the applied strain. Based upon these properties, the fluidic antenna is considered to have no or minimal hysteresis, as defined by the mechanical properties of the substrate in response to mechanical strain and release of mechanical strain.

As one example of channel formation within a two-part substrate, lithography, such as soft lithography or photolithography, may be used to form one or more channels within an elastomer that represents one portion of the two-part substrate. A "master" pattern of a negative shape of the channel may be generated on a silicon wafer using a negative photoresist (e.g., an epoxy-based SU-8 photoresist, Microchem, etc.). The pattern may be dimensioned according to a configured resting (e.g., non-elongated) dimension and resonant frequency of the fluidic antenna. An elastomer pre-polymer may be cured against the topographically patterned substrate described above, for example by replica molding, to produce an inverse replica of the master pattern of a negative shape of the channel with the portion of the two-part substrate. The elastomer may be exposed to a substance or stimulus, such as oxygen plasma, to help adhere the interface to another sheet of elastomer. The first portion of the two-part substrate may then be further processed by sealing a bonding layer material to the substrate and filling the channel with liquid metal, as described in more detail below.

Fluidic antenna models may be constructed and simulated numerically under multiple operating conditions using computational electromagnetic methods, such as, for example, finite element method (FEM) modeling or other computational electromagnetic method as appropriate for a given implementation. The replica molding described above may be utilized for rapid prototyping of new antenna designs, where a single "master" may be replicated to produce many identical antennas. As such, the present subject matter may further reduce new antenna design time.

The elastomer or elastomer pre-polymer as described above may include, for example, polydimethylsiloxane (PDMS). PDMS is a silicone elastomer, and has a low dielectric constant (on the order of 2.67) and a dielectric loss tangent (ranging from, for example, 0.001 at 100 kHz to 0.04 at 77 GHz). PDMS is highly elastic with a low Young's modulus (e.g., tensile modulus) of less than two megapascals (<2 MPa) and a low surface energy, thereby providing one example of a substrate that may provide adequate stretchability, deformability, and recoverability suitable for use in association with the present subject matter. PDMS may further conform to surfaces based upon these properties. As such, antennas of a variety of forms and shapes may be constructed based upon channel dimensions and form, in conjunction with mounting forms for the finished fluidic antenna.

As one example of an antenna that may be implemented utilizing the presented subject matter, a dipole antenna does not have significant resonant fields within a surrounding dielectric. As such, field densities inside a substrate such as PDMS are relatively low. Accordingly, PDMS represents one suitable casing/substrate material for dipole antennas. It is understood that many other possibilities exist for an elastomeric substrate and that certain materials may be suited to certain antenna geometries, and all such possibilities are considered within the scope of the present subject matter.

Example antenna designs that may benefit from the present subject matter may include fluidic antennas formed as a single element (e.g., single pole) antenna, a dipole antenna, a helix antenna, a coil antenna, a patch antenna, a swiss-cross antenna, a bow-tie antenna, a microstrip antenna, a horn antenna, a planar-inverted F-shaped antenna (PIFA), and an array of antennas. Many other variations on antenna design are possible using the present subject matter and all are considered within the scope of the present subject matter.

A fluid metal that includes a low-viscosity liquid at a manufacturing facility temperature may be used to form the fluidic antenna(s). Low temperature liquid metals (e.g., metals or metal alloys that remain fluidic at room temperature) may include alloys that are gallium (Ga) based. One example of a fluid metal that may be suitable for use in association with the present subject matter is eutectic gallium indium (EGaIn). EGaIn is a low viscosity (e.g., approximately twice the viscosity of water) liquid metal alloy at room temperature with a relatively high conductivity (on the order of $\sigma=3.4\times10^4$ Scm$^{-1}$ (siemens per centimeter)). EGaIn has a relatively low level of toxicity (e.g., compared to mercury or certain other substances) and may form conductive and mechanically stable structures in cavities, such as microfluidic channels or capillaries. EGaIn does not need to be heated prior to injection because it is a liquid at room temperature. Further, EGaIn maintains its fluidity after injection. As such, EGaIn may maintain continuity during deformation at many operating temperature conditions.

It is understood that liquids have surface tension that causes them to adopt a shape that minimizes the surface energy without external forces applied, such as for example a spherical shape. However, EGaIn forms a passivating oxide layer (e.g., it does not grow thicker with time) that provides mechanical stability to the liquid metal such that it may maintain its non-spherical structure in the microfluidic channels despite its high surface tension. As such, any material, such as EGaIn, that creates a thin oxide skin once filled into the microfluidic channel(s) and that provides mechanical stability to the fluid within the microfluidic channels may be suitable for use in association with the present subject matter. It is understood that many other possibilities exist for liquid metal antenna construction and all are considered within the scope of the present subject matter.

As described above, the metal described herein as an example for use with fluidic antennas is EGaIn. It should be understood that EGaIn is used herein for the purposes of example and that any conductive liquids, such as liquids with suspended metallic nanoparticles, that possesses similar properties may be used. EGaIn has a composition of approximately 75% Gallium (Ga) and 25% Indium (In) by weight, and has a melting point (m.p.) of fifteen and seven tenths degrees Celsius (15.7° C.). At ambient manufacturing facility temperatures, the EGaIn may fill the channel(s) rapidly. The EGaIn has a relatively high surface energy. However, once injected, the EGaIn creates a thin metal-oxide "skin" that keeps the fluid mechanically stable inside of the microfluidic channels despite the high surface energy of the metal. Further, an operating range for purposes of deformation and reconfiguration of a fluidic antenna constructed using EGaIn may be, for example, any temperature above 15.7° C. as based further upon properties of the substrate material. Other alloys, such as those that contain tin (Sn) or other alloys, may have a lower temperature range (e.g., melting point) for a liquid state. However, it should be noted that a fluidic antenna may be used below the melting point temperature of the liquid metal, though with possibly reduced reflow rates based upon the liquid metal used in any given implementation.

EGaIn is a low viscosity fluid. However, it should be noted that other fluids exist that may be utilized to form a reversibly deformable and mechanically tunable fluidic antenna, and all are considered within the scope of the present subject matter. As such, the elastomeric cavities define the mechanical properties of the antenna. The fluidic antennas resist permanent deformation (e.g., the antennas may return to their original state after removal of an applied stress). As such, the antennas may be deformed (e.g., stretched, bent, rolled, and twisted) reversibly without permanent mechanical or electrical hysteresis losses.

Because the conductive element of the fluidic antenna is a fluid (e.g., liquid metal), the mechanical properties and shape of the antenna are defined by the elastomeric substrate. The antennas may withstand applied strain that results in mechanical deformation (e.g., stretching, bending, rolling, and twisting, etc.) and return to their original state after removal of an applied strain due to the elastomeric properties of the substrate. The ability of the liquid metal to flow during deformation of the antenna provides electrical continuity during the applied strain. Accordingly, the shape, and as a result the function, of the antenna is reconfigurable.

The resonant frequency of the fluidic antenna(s) may be tuned mechanically by deforming the fluidic antenna via stretching, bending, twisting or other mechanical strain without hysteresis during strain relaxation. The ability to reconfigure the shape of the fluidic antenna and to tune the spectral response of fluidic antennas mechanically makes them suitable for sensing external forces. As such, the fluidic antennas may be used as sensors of strain in addition to being used in environments where impacts and other mechanical actions may be imparted onto antennas.

A fluidic antenna may further be elongated during mounting to bias the antenna to a known biased resonant frequency. Deviations in that biased resonant frequency as a result of compression or expansion of the fluidic antenna may then be detected. As such, the fluidic antenna may be used to sense contraction and expansion of building, bridge, vehicle, or other mechanical fastening locations or construction joints.

The liquid metal may also facilitate self-healing (e.g., they regain their conductivity) after removal of a razor blade or other sharp objects that create sharp cuts (e.g., across an axis of a fluidic antenna element) as long sufficient substrate material is present to allow the liquid metal to reflow and to allow the liquid metal on each side of the cut location to make contact and re-bond. It should be noted that under such circumstances, based upon the dimensionality of a given implementation, such a cut may create two distinct metal-air interfaces and the liquid metal may remain flush with the cut interface (i.e., not reflow into or out of the channel). The oxide skin may get "pinned" to the edges of the opening in the channel created by the cut location. When the antenna is relaxed after the sharp object is removed, it may return to its original conducting state provided sufficient mechanical integrity remains to allow the base material elastomer to contract back to its original shape. Pressing on the channels may cause the two metal interfaces to merge into a continuous element. As such, the soft interface of the fluidic antenna may facilitate reliable healing under moderate mechanical impacts.

Flexible fluidic antennas may be used in association with other flexible electronics by incorporation of electronics and sensors into flexible substrates such as textiles (e.g., fabrics), displays, and bandages without loss of ergonomic functionality of the respective textile. Flexible electronics may further utilize fluidic antennas to provide sensing or wireless communication capabilities. Many possibilities exist for flexible electronic applications based upon the subject matter described herein and all are considered within the scope of the present subject matter.

For example, detection of motion may be possible with fluidic antennas coupled to textiles and bandages to determine mobility or other factors. Physical rehabilitation and athletic analysis may also utilize fluidic antennas for determination of athletic performance and progress after injury. Many other possibilities exist for use of fluidic antennas in fabrics and all are considered within the scope of the present subject matter.

The ability to reversibly deform the fluidic antennas may also be used in association with compact deployment where such materials are, for example, rolled for shipping and unrolled for remote deployment. Use of antennas constructed of liquid metal during shipping via compact deployment may also increase durability and avoid damage.

The bendable nature of the fluidic antennas described herein makes them suitable for "smart antenna" applications. Beam-forming and beam-bending may be achieved via the mechanical properties of fluidic antennas. These devices may be useful, for example, in millimeter-wave applications (e.g., automotive radars, security and surveillance systems, and high-data rate wireless communication systems). Fluidic antennas may further be utilized in applications in which a portion of the antenna is intended to bend out of plane, such as mechanically scanned antennas, to improve on applications that utilize conventional electronics, such as electronic phase shifting arrays.

The fluidic antennas described herein may also provide improvement over conventional antennas, such as copper or other solid metal antennas, that are limited in the extent to which they can be stretched. Further, because the fluidic antennas may be encapsulated within an elastomeric substrate, fluidic antennas may further improve durability, and as such, reliability, of applications that have previously used conventional solid metal antennas.

The reversibly deformable and mechanically tunable fluidic antennas described herein may be manipulated in real time to allow prompt frequency shifting of the resonant frequency of the antennas. For purposes of the present description, real time shall include any time frame of sufficiently short duration as to provide reasonable response time for information processing acceptable to a user of the subject matter described. Additionally, the term "real time" shall include what is commonly termed "near real time"—generally meaning any time frame of sufficiently short duration as to provide reasonable response time for on-demand information processing acceptable to a user of the subject matter described (e.g., within a portion of a second or within a few seconds). These terms, while difficult to precisely define are well understood by those skilled in the art.

It is further understood that the shape, dimensions, and other geometries associated with the fluidic antennas described below in association with FIG. 1 through FIG. 6 are for illustration purposes only and are not to scale. It is understood that appropriate dimensions may be chosen for a given application based upon the description below.

FIG. 1 is an illustration of an example of an implementation of a reversibly deformable and mechanically tunable single element (e.g., single pole) fluidic antenna 100 (fluidic antenna 100 hereafter). It is understood that the reversibly deformable and mechanically tunable single element fluidic antenna 100 is described herein to detail certain aspects of manufacturing for reversibly deformable and mechanically tunable fluidic antennas.

It is understood that the fluidic antenna 100 may operate, for example, as a monopole, quarter-wave antenna when extended above a ground plane. The ground plane is omitted for ease of illustration purposes. However, it is understood that any suitable ground plane may be used or may be omitted as appropriate for a given implementation. A quarter-wave antenna resonates with a wavelength, $\lambda$, that is approximately four times that of the total antenna length, L ($\lambda=4$ L) and is inversely proportional to the resonant frequency ($\lambda=cv^{-1}$, where v is the resonant frequency, and c is the speed of light). It is further understood that a resonant frequency of the fluidic antenna 100 is proportional to the physical length, L, and may be changed by elongating the fluidic antenna 100, such as in response to strain on a structural element to which the fluidic antenna 100 is mounted. As discussed above, strain may be induced in a structural element, for example, in response to temperature changes, pressure changes, mechanical load changes, geographical changes, or any other change that results in a force on the structural element that deforms, elongates, shrinks, or otherwise changes the structural element. As such, a resonant frequency change associated with the fluidic antenna 100 may be used to determine a stress on a structural element (e.g., a tensile strain or a compressive strain) in response to a determination of the resonant frequency change, as described in more detail below beginning with FIG. 7 for an example of dipole antenna strain sensing implementation.

A base material 102 may be formed of any elastomeric or rigid material, such as a low dielectric constant low-loss tangent elastomer. Silicones represent a category of elastomers. However, there are several other embedding materials including several types of polymers (e.g., polybutadiene, polyisoprene, polysulfide rubber, silicone rubber, polyacrylic, co-polymers, ethylene vinyl acetate, etc.) that may be used as a substrate. A channel 104 is formed within the base material 102.

A bonding layer material 106 is sealed to the base material 102 to enclose/encase the channel 104 to form a cavity within the substrate. For use in association with an elastomer, a sealing process such as oxygen plasma may be used to seal the bonding layer material 106 to the base material 102.

The channel 104 defines a shape of the fluidic element of the fluidic antenna 100, while the selection of the elastomer for the base material 102 and the bonding layer material 106 defines one or more mechanical properties (e.g., elasticity, flexibility, etc.) for the fluidic antenna 100.

As such, mechanical properties of the fluidic antenna 100 may be defined and/or modified by selection of dimensions of the material 102 in conjunction with the bonding layer material 106. For certain implementations, such as strain sensing, the dimensions of the base material 102 and the bonding layer material 106 may be chosen based upon mechanical properties of a structural element upon which the fluidic antenna 100 is to be used to sense strain along with a resolution of resonant frequency of the fluidic antenna 100 that may be sensed within the given implementation environment.

A filling hole 108 and a filling hole 110 are shown in a cross-hatched manner to represent that they are sealed. The filling hole 108 and the filling hole 110 may be sealed, for example, by use of additional elastomeric material. The filling hole 108 and the filling hole 110 may be used to fill the channel 104 with liquid metal, and sealed in response to completion of the filling operation. The liquid metal may include a liquid metal that forms an oxidized layer that stabilizes the liquid metal within the channel 104 after the channel 104 is filled. However, while the present example illustrates a low-viscosity high-surface tension liquid metal, it is understood that a low viscosity and high surface tension liquid metal is not required. Any liquid metal that may be encapsulated within a cavity of a substrate may be used as appropriate for a given implementation. A liquid metal, such as eutectic gallium indium (EGaIn), may be used as the liquid metal for a fluidic antenna, such as the fluidic antenna 100. However, other liquid metals may be used, including several other gallium-based alloys.

Filling the channel 104 with the liquid metal may include either injecting the liquid metal into the channel 104 using the filling hole 108, for example, as an injection location. Injection of the liquid metal into the channel 104 may be terminated, for example, in response to the liquid metal flowing toward an outlet location of the channel 104, such as out the filling hole 110. Alternatively, the channel 104 may be filled with the liquid metal by drawing the liquid metal into one of the filling hole 108 and the filling hole 110 via a force, such as a vacuum, until the liquid metal emerges from the other of the filling hole 108 and the filling hole 110 or is filled to the desired location as appropriate for a given implementation.

It is understood that a rigid material with similar electrical properties to the base material 102 and the bonding layer material 106 described above may be used as appropriate for a given implementation. For example, in situ manufacturing of a fluidic antenna in association with a rigid circuit board or other implementation may be performed without requiring use of an elastomeric substrate. The ability of the fluid metal to alloy with many metals may further facilitate the direct electrical connection and incorporation of antennas onto substrates featuring electronic components for a variety of applications. Many possibilities exist for implementation of the subject matter described herein into electronic applications and all are considered within the scope of the present subject matter.

A detailed description of the various elements of the fluidic antenna 100 and a process for manufacturing the fluidic antenna 100 are described below beginning with FIG. 2. An additional example of a dipole antenna is described below beginning with FIG. 5.

Figure 2:
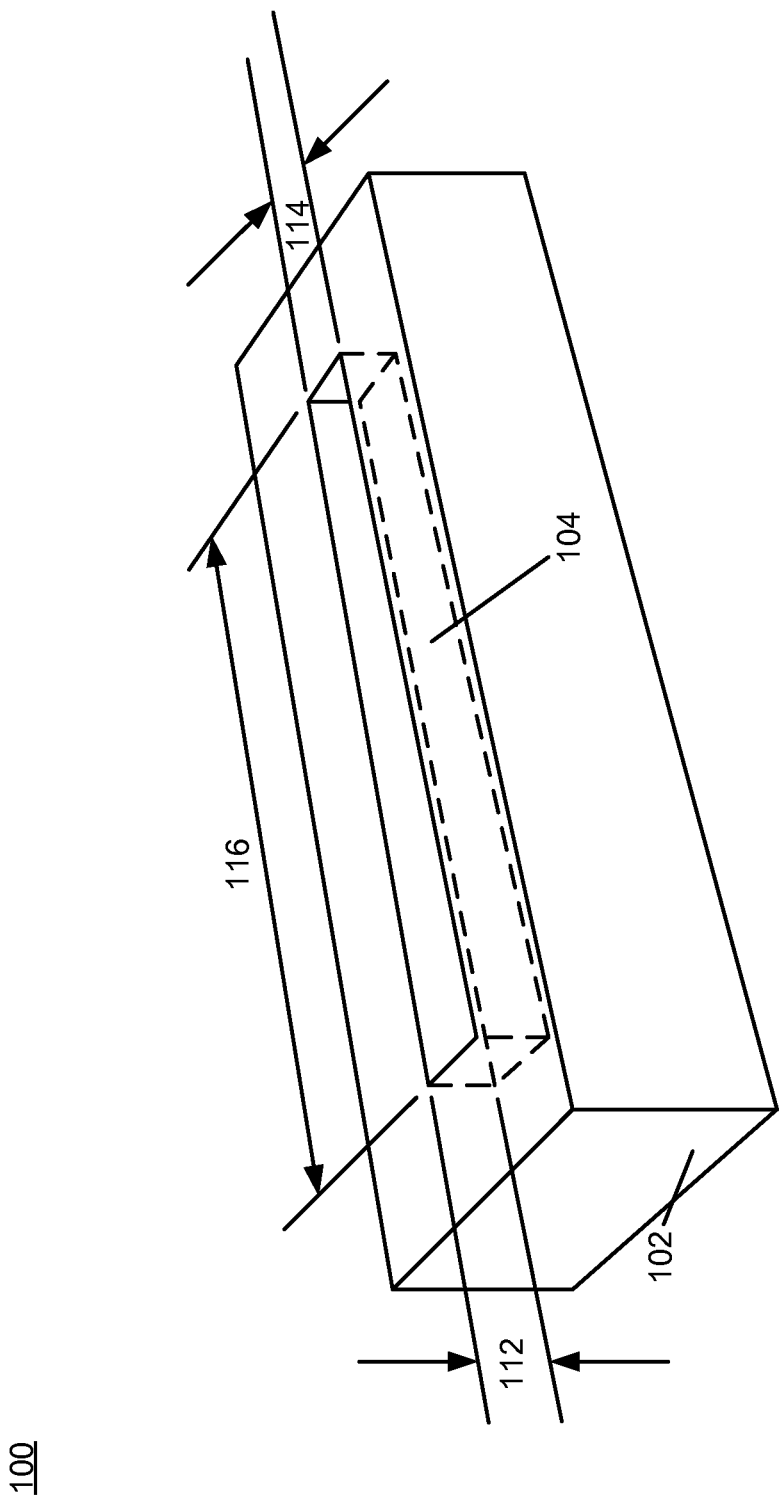
FIG. 2 is a detailed illustration of an example of an implementation of a base material that defines a shape of the fluidic antenna of FIG. 1 according to an embodiment of the present subject matter.

FIG. 2 is a detailed illustration of an example of an implementation of the base material 102 that defines a shape of the fluidic antenna 100 of FIG. 1. Regarding the fabrication/manufacturing of the base material 102 including the channel 104 for defining a shape of the fluidic antenna 100, photolithography, for example, may be used to generate a "master" pattern of a negative shape of the channel 104 on a silicon wafer using a negative photoresist (e.g., an epoxy-based SU-8 photoresist, Microchem, etc.). The pattern may be dimensioned according to a configured resting (e.g., non-elongated) dimension and resonant frequency of the fluidic antenna 100.

To form the base material 102, an elastomer pre-polymer (e.g., PDMS) may be cured against the topographically patterned substrate described above, for example by replica molding, to produce an inverse replica of the master pattern of a negative shape of the channel 104. The final base material 102 may then be further processed as described in association with FIG. 3 below.

With reference to FIG. 2, a channel depth 112 and a channel width 114 may be configured and may be selected based upon a configured volume of liquid metal, in conjunction with a channel length 116, to allow the liquid metal to flow under strain (e.g., elongation) and maintain conductivity. Presuming a fluidic antenna is in the low Gigahertz (GHz) range, an example dimension for the channel depth 112 may include a depth on the order of one hundred and fifty micrometers (150 μm) deep with a range/deviation from this example dimension on the order of fifty micrometers (50 μm) as appropriate for the given implementation. An example channel width 114 may include a width of one half millimeter (0.5 mm) wide with a range/deviation from this example dimension on the order of one tenth of a millimeter (0.1 mm) as appropriate for the given implementation. It is understood that a person of ordinary skill would be able to perform a mathematical calculation utilizing the quarter-wave equation(s) described above to arrive at an appropriate channel length 116 for a given target resonant frequency based upon the description herein. However, again presuming a fluidic antenna in the low GHz range, an example channel length 116 may include a length of twenty five and four tenths millimeters (25.4 mm) long, with a range/deviation from this example dimension on the order of one millimeter (1 mm) as appropriate for the given implementation. It should be noted that the present example provides certain dimensions, any dimensions appropriate for a given implementation may be used without departure from the scope of the present subject matter. For example, thickness of the liquid metal within the channel may be chosen based upon matching the dimensions of the liquid antenna to a feed that supplies signaling to the liquid antenna. Many other possibilities exist for dimensional selection. Additionally, other dimensions are possible as appropriate for a given implementation and all are considered within the scope of the present subject matter. Chosen dimensions may be verified by a verification process, such as profilometry.

As described above, dimensions (not labeled) of the base material 102 may be chosen as appropriate for a given implementation in conjunction with the dimensions of a bounding material, such as the bonding layer material 106, to arrive at final resting (e.g., non-elongated) dimensions for the fluidic antenna. For example, where a high resistive force is desired to counter strong strain forces, the dimensions of the base material 102 in conjunction with the bonding layer material 106 may be greater than an implementation where a relatively lower resistive force is desired to counter a lower relatively strain force.

Figure 3:
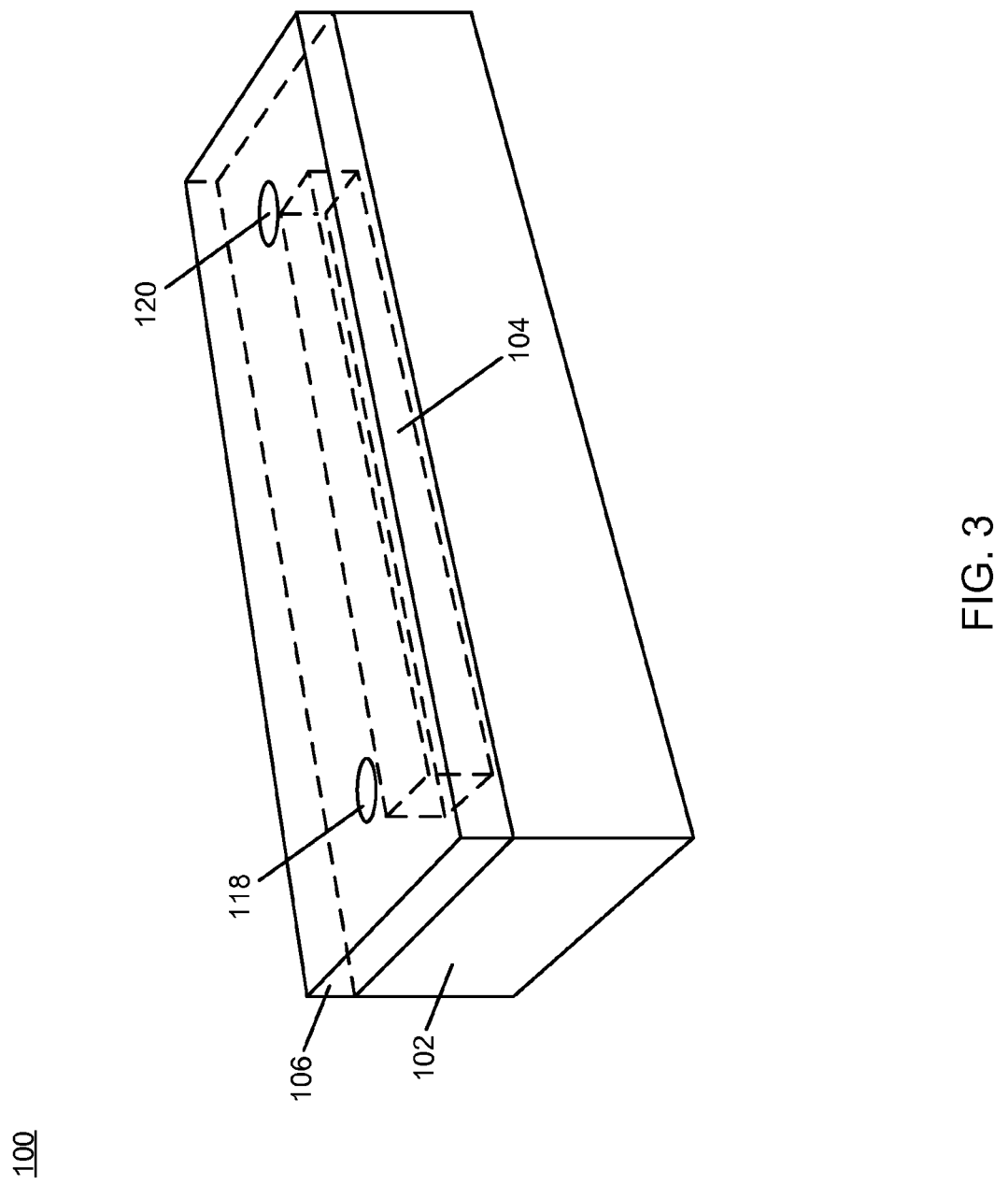
FIG. 3 is a detailed illustration of an example of an implementation of the base material sealed to the bonding layer material of the fluidic antenna of FIG. 1 according to an embodiment of the present subject matter.

FIG. 3 is a detailed illustration of an example of an implementation of the base material 102 sealed to the bonding layer material 106 of the fluidic antenna 100 of FIG. 1. As can be seen from FIG. 3, the bonding layer material 106 is represented as a flat material (e.g., PDMS of about ~1 mm thickness for a low GHz resonant frequency fluidic antenna). The bonding layer material 106 may be sealed to the base material 102 to produce a microfluidic channel or capillary into which the liquid metal may be injected or into which the liquid metal may be drawn. The bonding layer material 106 may be sealed to the base material 102 by oxygen plasma modification of the interface.

A hole 118 and a hole 120, each located proximate to one end of the channel 104 provide entry and exit paths for the liquid metal during filling of the channel 104, and allow for air in the channel 104 to be expelled when the channel 104 is filled with the liquid metal.

It should be noted that one of the hole 118 and the hole 120 may be formed by a liquid metal injection device (See FIG. 4) punched through the bonding layer material 106. As such, only one of the hole 118 and the hole 120 needs to be formed prior to injection. For a manufacturing process where liquid metal is to be drawn into the channel 104, one of the hole 118 and the hole 120 may be coupled to a vacuum system (not shown), while a liquid metal reservoir supply feed (also not shown) may be fitted to the other of the hole 118 and the hole 120 to allow the liquid metal to be drawn into the channel 104 via the vacuum force generated by the vacuum system. Many other possibilities exist for filling a microfluidic channel, such as the channel 104, and all are considered within the scope of the present subject matter.

Figure 4:
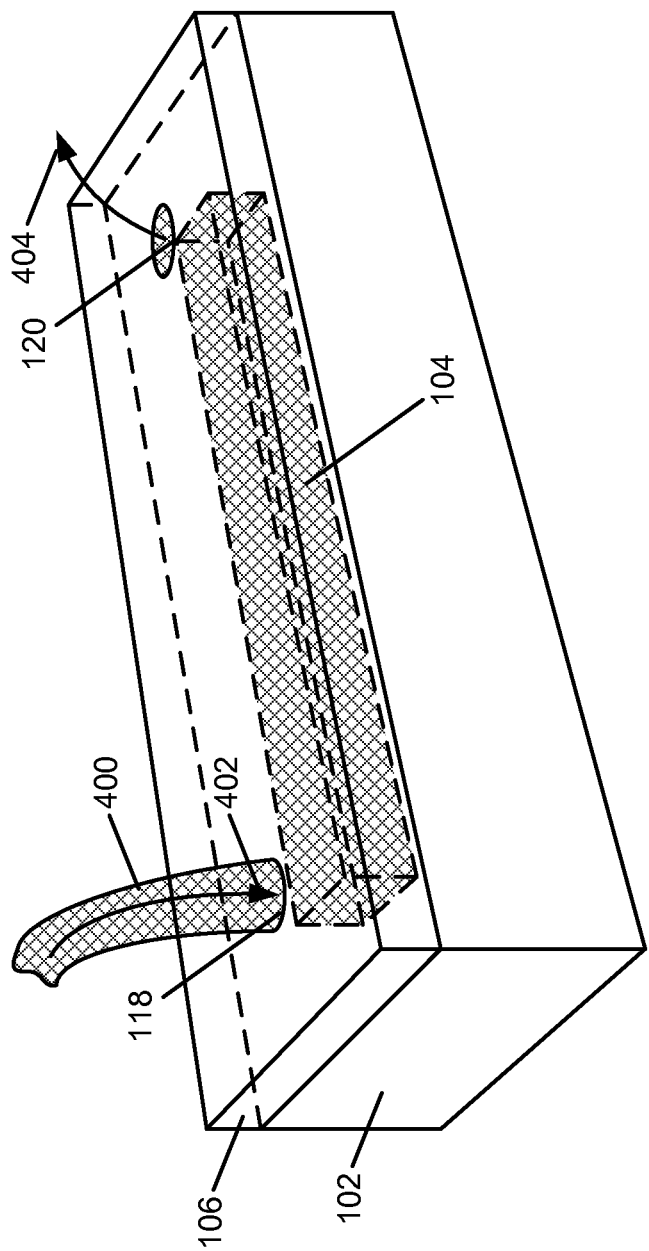
FIG. 4 is a detailed illustration of an example of an implementation of a process of injecting liquid metal into the cavity formed within the base material as sealed by the bonding layer material to form the fluidic antenna of FIG. 1 according to an embodiment of the present subject matter.

FIG. 4 is a detailed illustration of an example of an implementation of a process of injecting liquid metal into the channel 104 formed within the base material 102 as sealed by the bonding layer material 106 to form the fluidic antenna 100 of FIG. 1. As can be seen from FIG. 4, a liquid metal injection device 400 is shown inserted into the hole 118 with liquid metal flowing into the channel 104 and out of the hole 120, as represented by the arrows 402 and 404, respectively. It should be noted that an additional thin-layer of elastomer (e.g., PDMS) may be used to seal the hole 118 and hole 120 of the cavity to assist with handling after filling the channel 104 to form the fluidic antenna 100.

Figure 5:
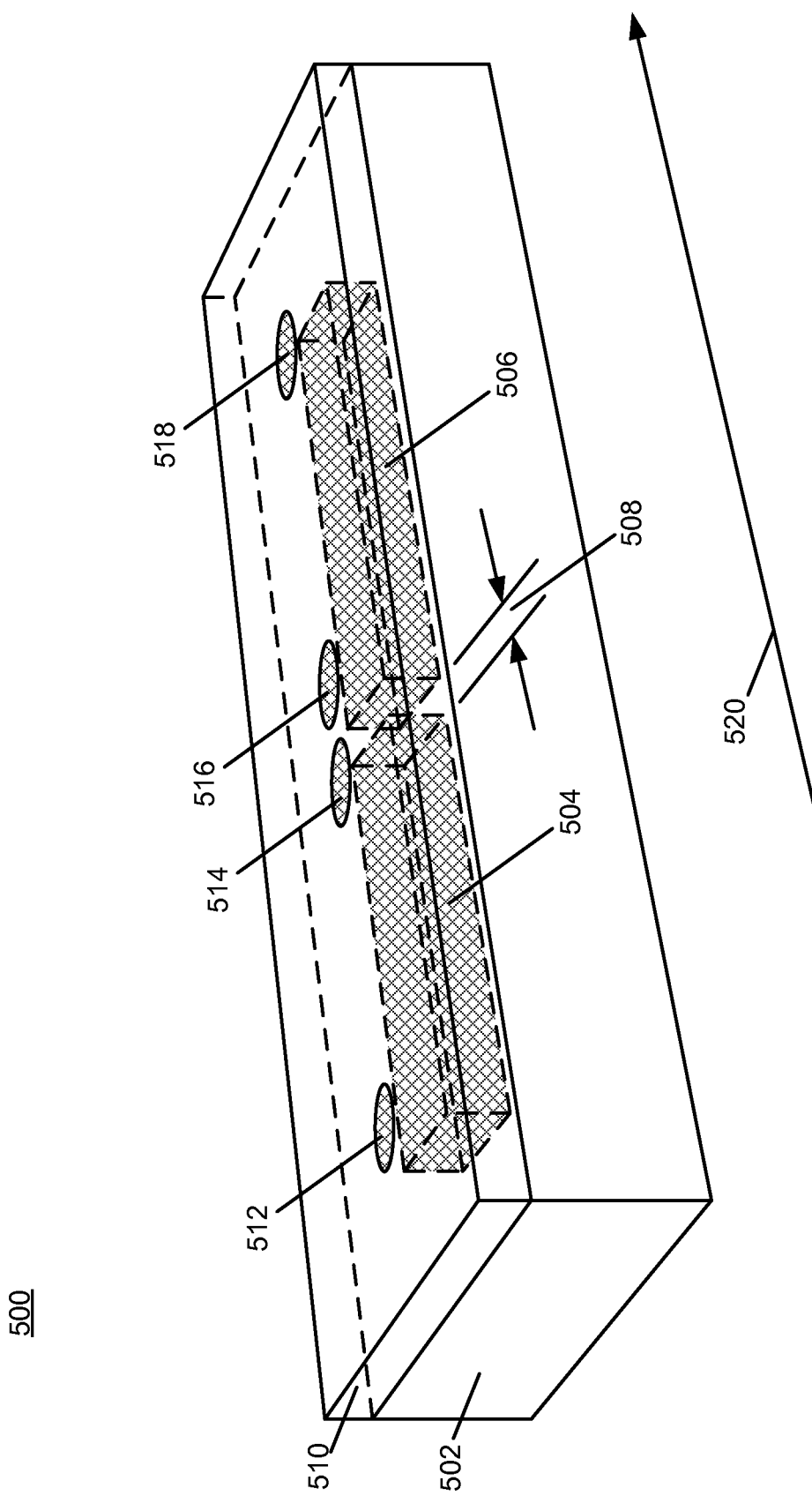
FIG. 5 is an illustration of an example of an implementation of a reversibly deformable and mechanically tunable dipole (dual element) fluidic antenna according to an embodiment of the present subject matter.

FIG. 5 is an illustration of an example of an implementation of a reversibly deformable and mechanically tunable dipole (dual element) fluidic antenna 500 (fluidic antenna 500 hereafter). It is understood that the fluidic antenna 500 may operate, for example, as a half-wave antenna. A half-wave antenna resonates with a wavelength, $\lambda$, that is approximately two times that of the total antenna length, L ($\lambda$, =2 L) and is inversely proportional to the resonant frequency ($\lambda = cv^{-1}$, where v is the resonant frequency, and c is the speed of light). It is further understood that a resonant frequency of the fluidic antenna 500 may be changed by elongating the fluidic antenna 500, such as in response to strain on a structural element to which the fluidic antenna 500 is mounted. As such, a resonant frequency change associated with the fluidic antenna 500 may be used to determine a stress on a structural element (e.g., a tensile stress or a compressive stress) in response to a determination of the resonant frequency change, as described in more detail below beginning with FIG. 7 for an example of dipole antenna strain sensing implementation.

It is understood that a dipole antenna includes two conductive rods of equal length that are aligned along their long axis and separated by an insulating gap. Each fluidic element of a dipole fluidic antenna, such as the fluidic antenna 500, may be aligned along their length axis and separated by a gap. The gap may include, for example, any gap (e.g., 2 mm) appropriate for a given implementation of a fluidic dipole antenna in the low GHz range.

A base material 502 may be formed, as described above for the fluidic antenna 100, of any elastomeric or rigid material, such as a low dielectric constant low loss tangent elastomer. Silicones represent a category of such elastomers. However, there are several other embedding materials including several types of polymers (e.g., polybutadiene, polyisoprene, polysulfide rubber, silicone rubber, polyacrylic, co-polymers, ethylene vinyl acetate, etc.) that may be used as a substrate.

A channel 504 and a channel 506 are formed within the base material 502. The channel 504 and a channel 506 formed within the base material 502 may each be formed similarly to the description above for the channel 104 of the fluidic antenna 100. As such, reference to the description of the fluidic antenna 100 and FIG. 1 through FIG. 4 provides appropriate details of the channel 504 and the channel 506 formed within the base material 502.

It should be noted that the channel 504 and a channel 506 formed within the base material 502 may be separated by a distance 508. The distance 508 may be selected as appropriate for a given implementation. One example for a fluidic antenna in the low GHz range may include a distance on the order of millimeters (e.g., 2 mm) While the present example describes certain dimensions, it is understood that any dimensions appropriate for a given implementation may be used. Other dimensions are possible as appropriate for a given implementation and all are considered within the scope of the present subject matter.

A bonding layer material 510 is sealed to the base material 502 to enclose/encase the channel 504 and a channel 506 to form two cavities within the substrate. For use in association with an elastomer, a sealing process such as oxygen plasma may be used to seal the bonding layer material 510 to the base material 502.

The channel 504 and a channel 506 each define a shape of one fluidic element of the fluidic antenna 500, while the selection of the elastomer for the base material 502 and the bonding layer material 510 defines one or more mechanical properties (e.g., elasticity, flexibility, etc.) for the fluidic antenna 500.

As such, mechanical properties of the fluidic antenna 500 may be defined and/or modified by selection of dimensions of the base material 502 in conjunction with the bonding layer material 510. For implementations, such as strain sensing, the dimensions of the base material 502 and the bonding layer material 510 may be chosen based upon mechanical properties of a structural element upon which a fluidic antenna is to be used to sense strain, along with a resolution of resonant frequency of the fluidic antenna 500 that may be sensed within the given implementation environment.

A filling hole 512 and a filling hole 514 are associated with the channel 504 and are shown in a cross-hatched manner to represent that they are sealed. A filling hole 516 and a filling hole 518 are associated with the channel 506 and are shown in a cross-hatched manner to represent that they are sealed.

The filling hole 512 through the filling hole 518 may be sealed, for example, by use of additional elastomeric material. The filling hole 512 and the filling hole 514 may be used to fill the channel 504 with liquid metal, while the filling hole 516 and the filling hole 518 may be used to fill the channel 506 with liquid metal, as described above in association with FIG. 4. The filling hole 512 through the filling hole 518 may be sealed in response to completion of the filling operation for the respective cavities. The liquid metal may include a low-viscosity high-surface tension liquid metal that forms an oxidized layer that stabilizes the liquid metal within the channel 504 and the channel 506 after the respective cavity is filled. A liquid metal, such as eutectic gallium indium (EGaIn), may be used as the liquid metal for a fluidic antenna, such as the fluidic antenna 500. Filling of the channel 504 and the channel 506 with the liquid metal may be performed as described above in association with FIG. 1 through FIG. 4.

It is understood that a rigid material with similar electrical properties to the base material 502 and the bonding layer material 510 described above may be used as appropriate for a given implementation. For example, in situ manufacturing of a fluidic antenna in association with a rigid circuit board or other implementation may be performed without requiring use of an elastomeric substrate. Many possibilities exist for implementation of the subject matter described herein and all are considered within the scope of the present subject matter.

An arrow 520 illustrates a direction of elongation of the fluidic antenna 500. As the fluidic antenna 500 is stretched relative to an axis of the fluidic antenna 500 (not shown) proximately parallel to the arrow 520, the channel 504 and the channel 506 will elongate. A distance of stretch (e.g., length plus a delta length) of the respective channels and the new total length of the fluidic antenna 500 may be used in conjunction with the half-wave equation described above to determine a new resonant frequency. It is understood that an increased length may result in a lower resonant frequency.

Similarly, the fluidic antenna 500 may be mounted with a biased elongation (e.g., longer than its resting non-elongated length) and a biased resonant frequency may be determined Using a biased elongation and biased resonant frequency, tension and compression forces may be determined. Elongation (e.g., tension) and contraction (e.g., compression) of the fluidic antenna 500 may be determined, by, for example, a decrease and an increase in the resonant frequency relative to the bias resonant frequency, respectively. Reference is again made to the half-wave equation above for mathematical reference. Many possibilities exist for strain and stress measurement based upon the present subject matter and all are considered within the scope of the present subject matter.

Regarding testing and verification associated with spectral properties of a fluidic antenna as described herein, or circuitry for implementation and driving such a fluidic antenna, a series network analyzer or similar circuitry may be used to measure the spectral properties of the fluidic antenna 100 or the fluidic antenna 500, or a different fluidic antenna. Using the fluidic antenna 500 as an example, a balanced-to-unbalanced (e.g., balun) transformer may be used to drive the fluidic antenna 500. The balanced-to-unbalanced transformer may convert an "unbalanced" (e.g., grounded) coaxial cable from the network analyzer to a "balanced" (e.g., ungrounded) antenna input.

Given the elastomeric properties of the fluidic antenna construction described herein, solder or other types of circuit connectivity are not needed. Leads for connection to circuitry to drive or receive signaling may be inserted directly into the fluidic liquid metal antenna elements, such as the channel 504 and the channel 506. Insertion of the leads may be proximate to the filling hole 514 and the filling hole 516, respectively, for the fluidic antenna 500. Continuity may be achieved via the fluidic surface contact of the respective leads to the liquid metal filled within the channel 504 and the channel 506. Accordingly, installation complexity of strain sensor circuitry on bridges or buildings may be significantly reduced and safety may be improved by use of the fluidic antennas described herein.

To provide additional detail regarding verification and circuit performance of a fluidic antenna as described herein, the network analyzer may transmit incident electromagnetic waves into a fluidic antenna and measure the amount of energy reflected back to the network analyzer as a function of frequency. The reflection coefficient, $\Gamma$, represents a ratio of the reflected voltage and the incident voltage. For each frequency in a frequency sweep, the network analyzer may calculate a reflection coefficient. The reflection coefficient may be represented in decibels (dB). In decibels, the reflection coefficient, or return loss, may be represented as negative twenty multiplied by a logarithm of a magnitude of a complex form of the reflection coefficient (e.g., $-20 \log |\Gamma|$) where $|\Gamma|$ is the magnitude of the complex reflection coefficient. The frequency with the lowest return loss represents the resonant frequency of the antenna. As described below in association with FIG. 6, the resonant frequency may be changed by elongation of a fluidic antenna, such as the fluidic antenna 500.

Spectral properties and efficiency of a fluidic antenna, such as the fluidic antenna 500, may be characterized in "free space" position (e.g., not stretched or clamped). A fluidic antenna formed as described herein may resonate, for example, a configured frequency with approximately ninety percent ($\approx$90%) radiation efficiency as measured by a far-field, anechoic chamber. The radiation efficiency may be defined as a ratio of total power radiated by the fluidic antenna to the power delivered to an input of the fluidic antenna.

Regarding an example of an apparatus for deforming (e.g., stretching) a fluidic antenna to minimize human bias in measurements, a device containing no metal parts may be used to avoid electronic coupling with the antenna and may improve interpretation of results. Such a device may consist of two clamps formed of plastic (e.g., Delrin) that each grab one end of the fluidic antenna. The clamps may be formed to slide along glass rods parallel to a length axis of the fluidic antenna. Plastic screws may be used to exert a force that separates the two clamps, thereby causing the fluidic antenna to elongate in a controlled manner. It is understood that a person of ordinary skill would be capable of fabricating such a device based upon the description above.

The liquid metal in the elastomer may maintain its electrical continuity during stretching to provide circuit connectivity and transmission/reception capabilities during stretching and contraction of the fluidic antenna. Although the cross-sectional area of the fluidic antenna reduces during elongation to maintain its total volume (e.g., the Poisson ratio of PDMS is 0.5), the length of the liquid metal may be directly proportional to the length of elastomer within which it is enclosed.

Figure 6:
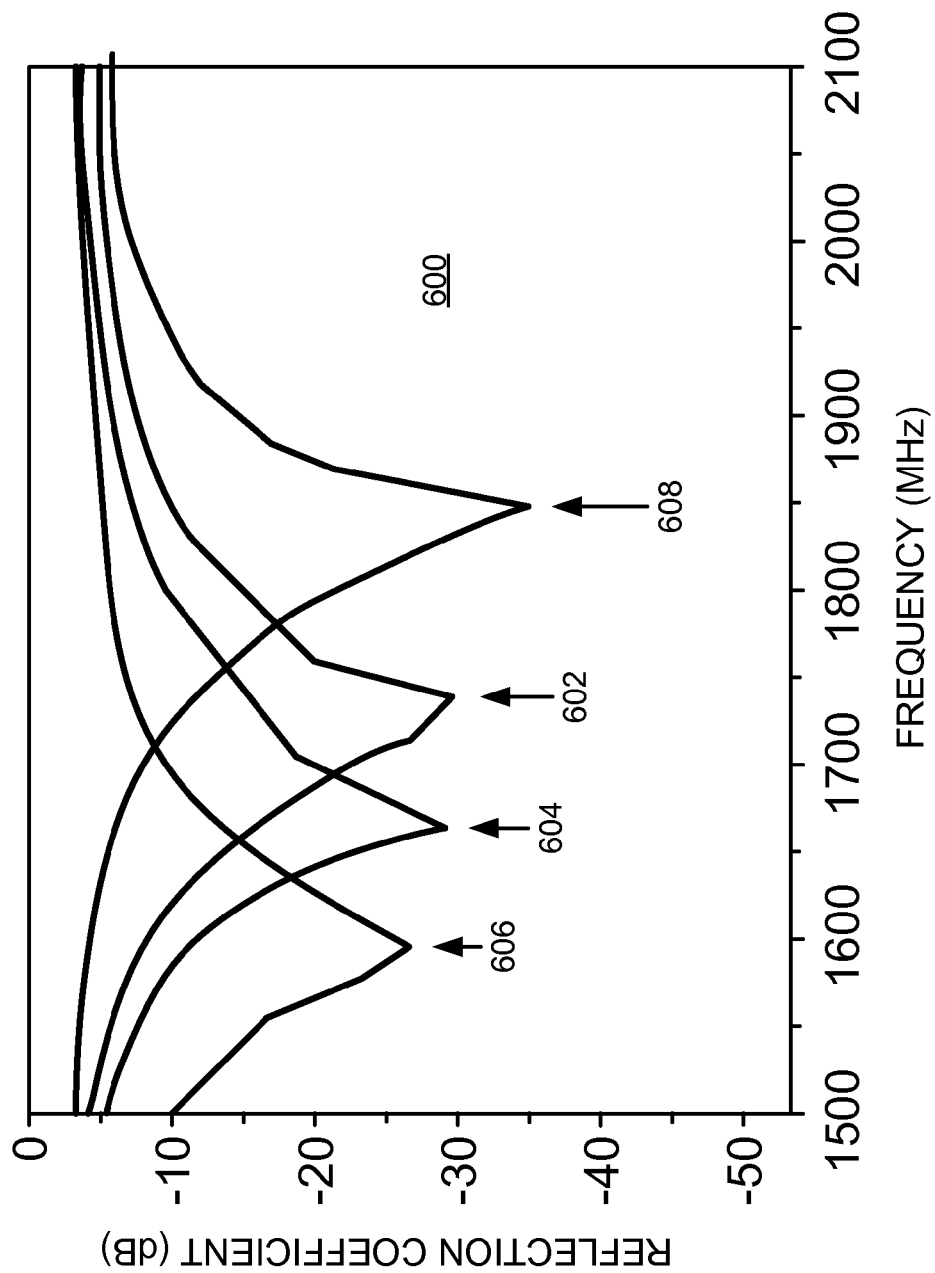
FIG. 6 is an illustration of an example of an implementation of a set of resonant frequency response curves for a fluidic dipole antenna, such as the fluidic antenna, under different strain conditions (e.g., tension and compression forces) according to an embodiment of the present subject matter.

FIG. 6 is an illustration of an example of an implementation of a set of resonant frequency response curves 600 for a fluidic dipole antenna, such as the fluidic antenna 500, under different strain conditions (e.g., tension and compression forces). As described above, elongating the fluidic antenna may change (e.g., modulate) the spectral response. Additionally, where a fluidic antenna is mounted with a biased elongation that results in a biased resonant frequency response, a compressive force that allows contraction of the fluidic antenna may also change (e.g., modulate) the spectral response. As such, the fluidic antennas may be used to sense strain (e.g., tension and compression forces).

A resonance frequency (or biased resonant frequency) of a fluidic antenna may be determined within a lab or during a strain sensing installation using a radio frequency network analyzer, spectrum analyzer, or similar circuitry, as appropriate for a given implementation. A reflection coefficient below negative ten decibels ($-10$ dB) may be considered sufficient for effective radiation in commercial antennas. The spectral response may be recorded as a function of the length of the antenna (measured for example using calipers) at millimeter (e.g., 2 mm) increments. The results may be plotted as a series of curves.

As can be seen within FIG. 6, a biased resonant frequency curve 602 represents, within the present example, an example biased elongation of installation of a fluidic antenna. For a given elongation from the bias installation length, such as a measurable millimeter elongation (e.g., 4 mm), an example first tension resonant frequency curve 604 represents a lower resonant frequency. If the fluidic antenna is stretched further, such as another measurable millimeter elongation (e.g., another 4 mm), an example second tension resonant frequency curve 606 represents a second lower resonant frequency. If the fluidic antenna is returned to its original biased installation elongation and a compressive force is applied such that the fluidic antenna is allowed to contract (e.g., 4 mm relative to the biased elongation) due to the elastomeric properties of the materials that enclose the liquid metal, an example contraction resonant frequency curve 608 represents a higher resonant frequency.

As such, resonant frequency of the fluidic antennas described herein may be used to determine stress/strain on a structure. The resonant frequency of the fluidic antenna may decrease with increasing antenna length. Further, it should be noted that resonant frequency during a release of an applied strain may allow a fluidic antenna to return to its default elongation (e.g., biased for a biased installation) without exhibiting hysteresis. Accordingly, a fluidic antenna may be considered reversibly stretchable and the resonant frequency indicative of the length of a fluidic antenna regardless of whether strain is increasing or decreasing. However, it is understood that as described above, dimensions of a base material and substrate may be chosen as appropriate for a given implementation to avoid fatigue or destruction of the base material and substrate during applied stresses or strains.

It is also understood that the axes relative to which the set of resonant frequency response curves 600 are presented within FIG. 6 are for purposes of example. Other axes or resolution of axes may be appropriate based upon the given implementation.

With further consideration for simulation and verification, computational electromagnetic methods and simulators, such as, for example, a finite element model (FEM) method and simulator or other computational electromagnetic simulator may be used as appropriate for a given implementation to model the resonant frequency of a fluidic antenna as a function of induced strain. An input file, such as a computer-aided design (CAD) file input or other file as appropriate for a given implementation, used as input into the simulator may be used to identify physical geometries and electric properties of each element within and surrounding a fluidic antenna. Such a model may further be implemented to account for geometry change of a fluidic antenna (as a function of strain), the presence of an elastomer dielectric (e.g., PDMS), and the surrounding clamping fixture to be utilized in the given implementation. Simulated resonance frequency may then be compared with a measured resonance frequency, both prior to and in the context of applied stress.

Figure 7:
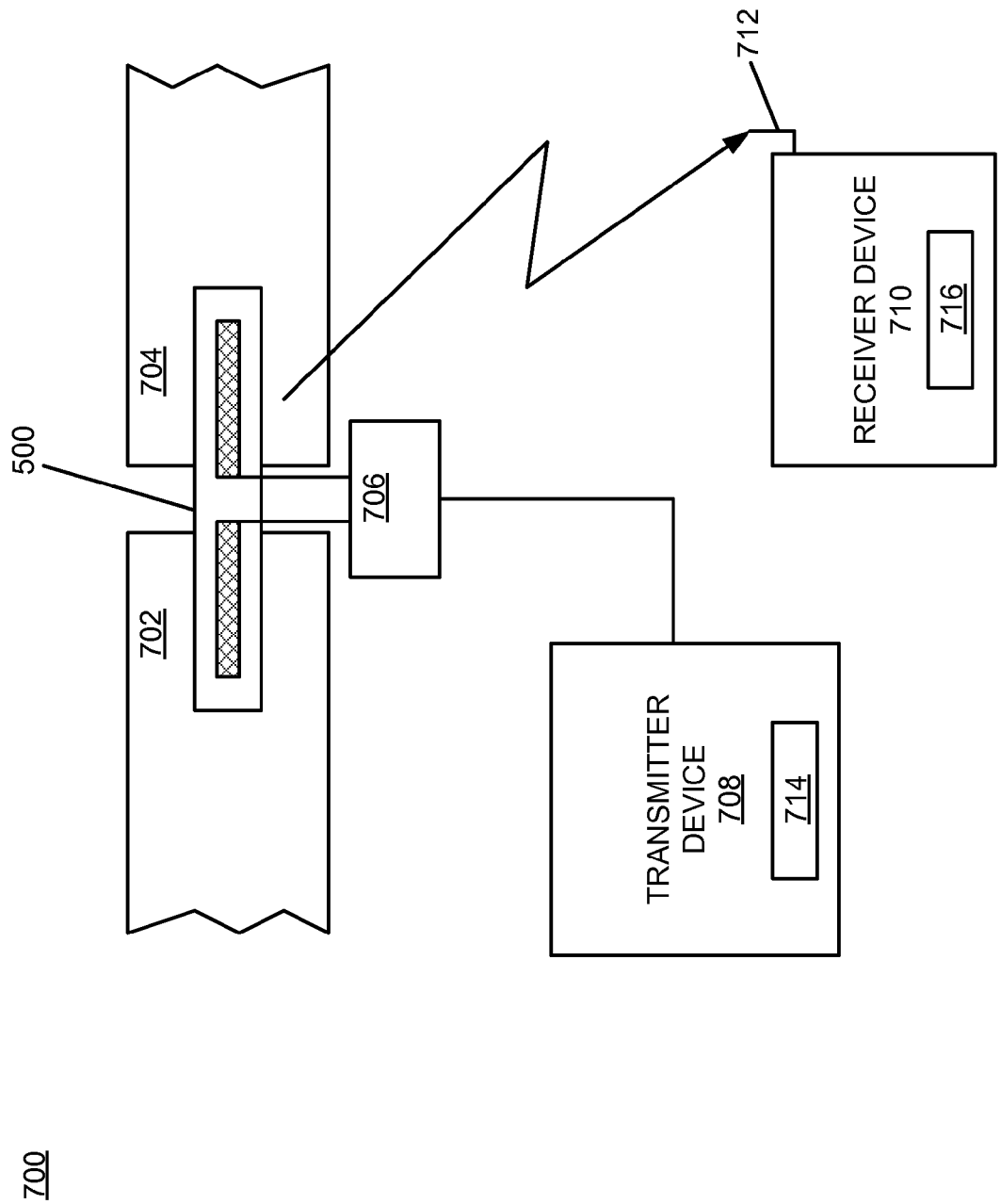
FIG. 7 is a block diagram of an example of an implementation of a strain sensing system that utilizes the reversibly deformable and mechanically tunable dipole fluidic antenna of FIG. 5 according to an embodiment of the present subject matter.

FIG. 7 is a block diagram of an example of an implementation of a strain sensing system 700 that utilizes the reversibly deformable and mechanically tunable dipole (dual element) fluidic antenna 500 (fluidic antenna 500 hereafter) of FIG. 5. The fluidic antenna 500 is shown mounted to a structural abutment presented by a structural member 702 and a structural member 704. As can be seen from FIG. 7, the fluidic antenna 500 spans a gap between the structural member 702 and the structural member 704. While the present example shows the fluidic antenna 500 mounted across a gap between the structural member 702 and the structural member 704, this should not be considered limiting as the fluidic antenna 500 may be mounted to a solid section of a structural member and materials may be selected for construction of a fluidic antenna for sensing elongation and contraction of a single structural member in conjunction with a coefficient of linear expansion of the respective structural member without departure from the scope of the present subject matter. Additionally, the structural member 702 and the structural member 704 may include one or more portions of a flexible fabric or other material as described above.

A balun 706 couples a transmitter device 708 to the fluidic antenna 500 as described in more detail above in FIG. 5. The transmitter device 708 generates a signal that is propagated by the fluidic antenna 500. The signal may include any signal appropriate for a given implementation, such as for example, a continuous sinusoidal signal, or any other signal appropriate for a given implementation. The signal may further include information, such as identifying information that identifies the fluidic antenna 500, within a given installation. For example, for an implementation that includes multiple fluidic antennas, radio frequency identification (RFID) may be used to identify a signal transmitted by each of a group of transmitter devices, such as the transmitter device 708. As such, RFID, or other technologies may be used to identify signals generated by multiple fluidic antennas.

A receiver device 710 may receive the signal generated by the transmitter device 708 via a receiving antenna 712. The receiving antenna 712 may be a rigid antenna, but may also be a fluidic antenna or other antenna as appropriate for a given implementation. Regarding use of a fluidic antenna as the receiving antenna 712, a fluidic receiving antenna may be mounted to an assembly that allows mechanical control elements (not shown) of the receiver device 710 to stretch the fluidic receiving antenna, and power of a received signal may be determined where a maximum received power may be correlated with a current length of the fluidic receiving antenna to determine a resonant frequency of the fluidic antenna 500. As such, length matching may be utilized via power measurement between transmitting and receiving fluidic antennas. Alternatively, a single rigid antenna may be used with spectral analysis to identify a resonant frequency of the fluidic antenna 500, or an array of rigid antennas may be used in a similar manner, each tuned to a different frequency. Many other possibilities exist for determination of a resonant frequency of a fluidic antenna, such as the fluidic antenna 500, and all are considered within the scope of the present subject matter.

As described above, the signal generated by the transmitter device 708 may change frequency as the fluidic antenna 500 elongates or contracts based upon tensile or compressive forces generated by the structural member 702 and the structural member 704, respectively. As such, the receiver device 710 may detect a resonant frequency of the signal generated by the transmitter device 708 as modified by the strain/stress applied on the structural member 702 and the structural member 704, as represented by a resonant frequency of the fluidic antenna 500. The receiver device 710 may process the received frequency to determine the resonant frequency of the fluidic antenna 500 and may determine a tensile or compressive force applied by the structural member 702 and the structural member 704.

As described above, the fluidic antenna 500 may be mounted with a biased elongation that results in a biased resonant frequency of the fluidic antenna 500. As such, a tensile force may be determined by detection via the receiver device 710 of a lower resonant frequency relative to the biased resonant frequency of the fluidic antenna 500. Similarly, a compressive force may be determined by detection via the receiver device 710 of a higher resonant frequency relative to the biased resonant frequency of the fluidic antenna 500. For a non-biased installation, tensile strain may be sensed via a lower resonant frequency relative to the fluidic antenna 500 and relative to a resting (e.g., non-elongated) resonant frequency.

Additionally, as described above, where multiple fluidic antennas are utilized within a given implementation, one or more receiver devices, such as the receiver device 710, may be used to determine an RFID associated with each installed fluidic antenna and may determine a strain/stress applied to each such fluidic antenna. Many other possibilities exist for wireless communications, wireless strain sensing, and fluidic antenna identification, and all are considered within the scope of the present subject matter.

It should be noted that the transmitter device 708 and the receiver device 710 may be incorporated into the same physical device without departure from the scope of the present subject matter. As such, reference to either device may be considered a reference to the other as appropriate for a given implementation. It should also be understood that the transmitter device 708 and the receiver device 710 may each include one or more processors, memories, communication modules, user input modules, user output modules, and processing modules to perform the subject matter described herein for strain sensing.

A processing module 714 associated with the transmitter device 708 and a processing module 716 associated with the receiver device 710 may perform the subject matter described herein for strain sensing. The processing module 714 may transmit a signal, such as described above, that may alternatively include RFID or other information. The processing module 716 may receive and process such a signal.

The processing module 714 and the processing module 716 may be implemented as a combination of hardware and software components, or as a collection of circuit components, as a custom integrated circuit (e.g., an application specific integrated circuit (ASIC)), as a field programmable gate array (FPGA) programmed processing module, or other circuitry. The processing module may form a portion of other circuitry described without departure from the scope of the present subject matter.

Further, such a processing module may alternatively be implemented as an application stored within a memory and executed by one or more processor. In such an implementation, a processing module may include instructions executed by one or more processors for performing the functionality described herein. The processor(s) may execute these instructions to provide the processing capabilities described above and in more detail below for a device, such as the receiver device 710. The processing module may form a portion of an interrupt service routine (ISR), a portion of an operating system, a portion of a browser application, or a portion of a separate application without departure from the scope of the present subject matter.

It should be noted that the receiver device 710 may be stationary and attached proximate to a structure or may be a portable computing device, either by a user's ability to move the receiver device 710 to different locations, or by the receiver device 710's association with a portable platform, such as a plane, train, automobile, or other moving vehicle. For example, where the receiver device 710 is associated with a moving vehicle (e.g., a train) that regularly travels a path that includes a bridge, the receiver device 710 may log (e.g., store) strain determinations over time and make additional strain determinations during each traverse of the respective bridge. Comparisons, such as statistical deviations or other mathematical processing, of current strain determinations with historic strain determinations may be performed to determine deviations from expected strain results. Such deviations may be used to predict reliability or failure of a given structural element, such as a bridge.

Similarly, the receiver device 710 may be collocated with a structure, such as a bridge, and receive RFID information and other information from passing vehicles, such as weight of each vehicle, to determine differences in strain for different loads. These determined differences in strain may be used to predict reliability or failure of a given structural element, such as a bridge.

It should also be noted that the receiver device 710 may be any computing device capable of processing information as described above and in more detail below. For example, the receiver device 710 may include devices such as a personal computer (e.g., desktop, laptop, a handheld device (e.g., cellular telephone, personal digital assistant (PDA), email device, etc.), or any other device capable of processing information as described in more detail below.

The receiver device may further be interconnected via a network (not shown) for communication of strain sensing determinations to other locations for storage or additional processing. The network may include any form of interconnection suitable for the intended purpose, including a private or public network such as an intranet or the Internet, respectively, direct inter-module interconnection, dial-up, wireless, or any other interconnection mechanism capable of interconnecting the respective devices.

As such, the receiver device 710 may include an entirely embedded device that communicates strain determinations without mechanically coupled user interface input or output capabilities. A wireless user interface may also be provided for the receiver device 710, as appropriate for a given implementation. For example, a passing vehicle on a bridge may query an RFID of each receiver device, such as the receiver device 710, and log (e.g., store) strain determinations. Many possible implementations exist for a receiver device, such as the receiver device 710, and all are considered within the scope of the present subject matter.

FIG. 8 through FIG. 11 below describe example processes that may be executed by devices, such as a manufacturing device or devices such as the receiver device 710, for processing associated with reversibly deformable and mechanically tunable fluidic antennas. Many other variations on the example processes are possible and all are considered within the scope of the present subject matter. It should be noted that time out procedures and other error control procedures are not illustrated within the example processes described below for ease of illustration purposes. However, it is understood that all such procedures are considered to be within the scope of the present subject matter.

Figure 8:
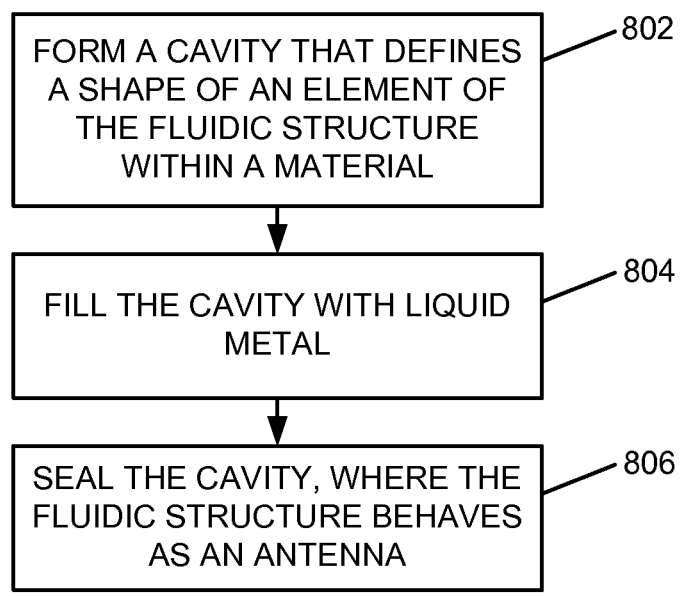
FIG. 8 is a flow chart of an example of an implementation of a process for manufacturing a reversibly deformable and mechanically tunable fluidic antenna as a fluidic structure according to an embodiment of the present subject matter.

FIG. 8 is a flow chart of an example of an implementation of a process 800 for manufacturing a reversibly deformable and mechanically tunable fluidic antenna as a fluidic structure. At block 802, the process 800 forms a cavity that defines a shape of an element of the fluidic structure within a material. At block 804, the process 800 fills the cavity with liquid metal. At block 806, the process 800 seals the cavity, where the fluidic structure behaves as an antenna.

Figure 9:
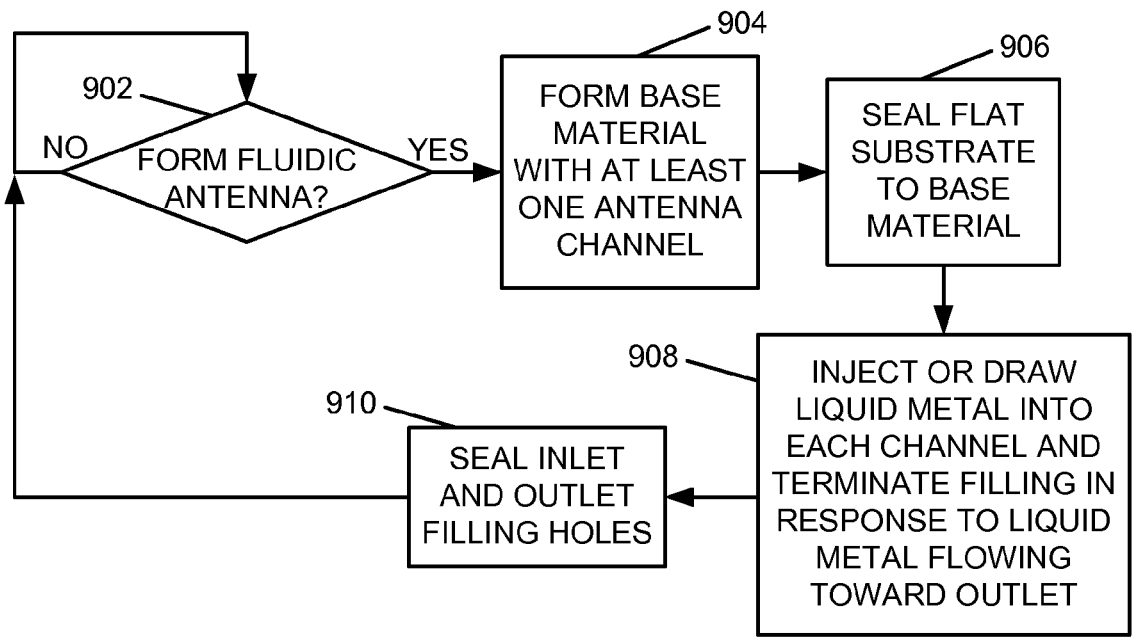
FIG. 9 is a flow chart of an example of an implementation of a process for manufacturing a reversibly deformable and mechanically tunable fluidic antenna using a two-part substrate according to an embodiment of the present subject matter.

FIG. 9 is a flow chart of an example of an implementation of a process 900 for manufacturing a reversibly deformable and mechanically tunable fluidic antenna using a two-part substrate. At decision point 902, the process 900 makes a determination as to whether to form a fluidic antenna. In response to determining to form a fluidic antenna, the process 900 forms a base material with at least one antenna channel that defines a shape of an element of the fluidic antenna within a base material. As described above, a base material may include an elastomeric base material made via a negative photoresist process, lithography, injection molding, imprinting, molding, stamping, and milling the material, or other process as appropriate for a given implementation. At block 906, the process 900 seals a flat substrate to the base material to form a completed substrate for the fluidic antenna. Sealing the flat substrate to the base material may include coupling an elastomer bonding layer material to an elastomer base material portion that seals a length of the at least one channel. It should be understood that while the present example utilizes a flat substrate, many other substrate formations are possible. For example, a substrate may also include a cavity or form another shape for sealing a length of the at least one channel. Accordingly, any such substrate is considered within the scope of the present subject matter.

At block 908, the process 900 injects or draws liquid metal into each channel in the substrate and terminates filling when the metal is in the desired shape. At block 910, the process 910 seals inlet and outlet filling holes to complete formation of the fluidic antenna.

It should be noted that the process 900 may be performed in situ or ex situ. For in situ operations, the base material may be coupled to a circuit assembly and the channel filled with the liquid metal in situ while the material is coupled to the circuit assembly. Further, because the liquid metal is liquid at room temperature, the channel may be filled with the liquid metal at room temperature.

Figure 10:
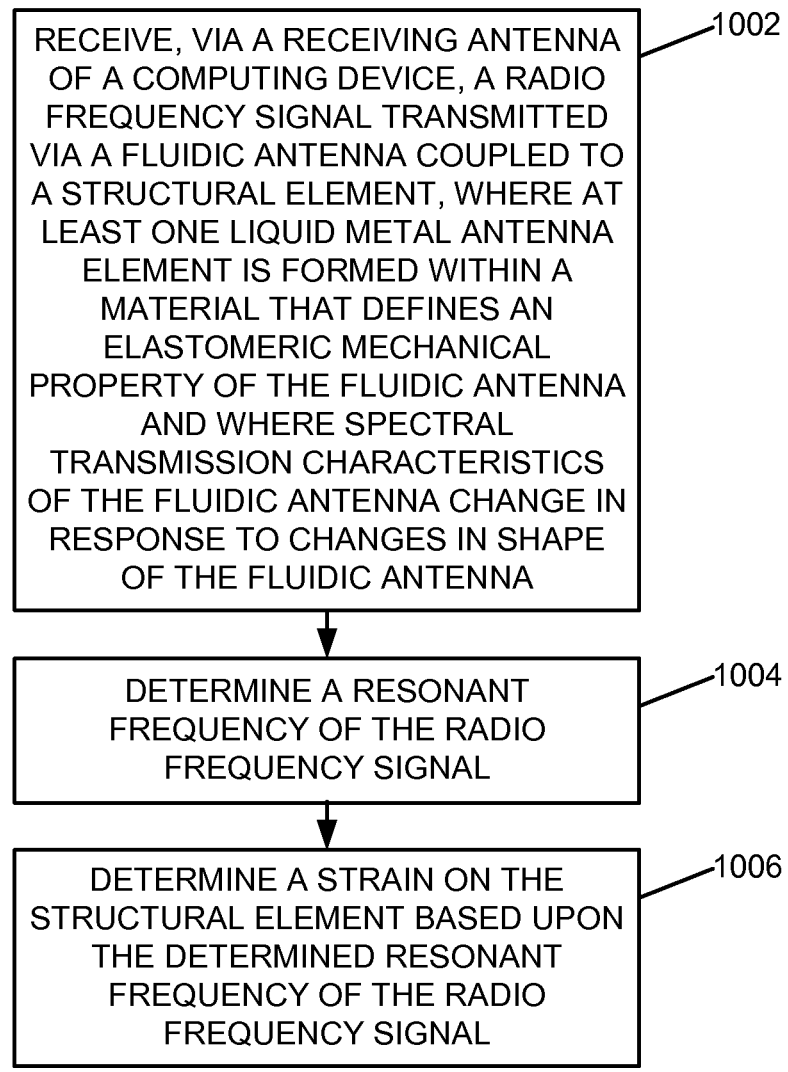
FIG. 10 is a flow chart of an example of an implementation of a process for determining a strain on one or more structural elements using a reversibly deformable and mechanically tunable fluidic antenna according to an embodiment of the present subject matter.

FIG. 10 is a flow chart of an example of an implementation of a process 1000 for determining a strain on one or more structural elements using a reversibly deformable and mechanically tunable fluidic antenna. At decision point 1002, the process 1000 receives, via a receiving antenna of a computing device, a radio frequency signal transmitted via a fluidic antenna coupled to a structural element, where at least one liquid metal antenna element is formed within a material that defines an elastomeric mechanical property of the fluidic antenna and spectral transmission characteristics of the fluidic antenna change in response to changes in shape of the fluidic antenna. At block 1004, the process 1000 determines a resonant frequency of the radio frequency signal. At block 1006, the process 1000 determines a strain on the structural element based upon the determined resonant frequency of the radio frequency signal.

Figure 11:
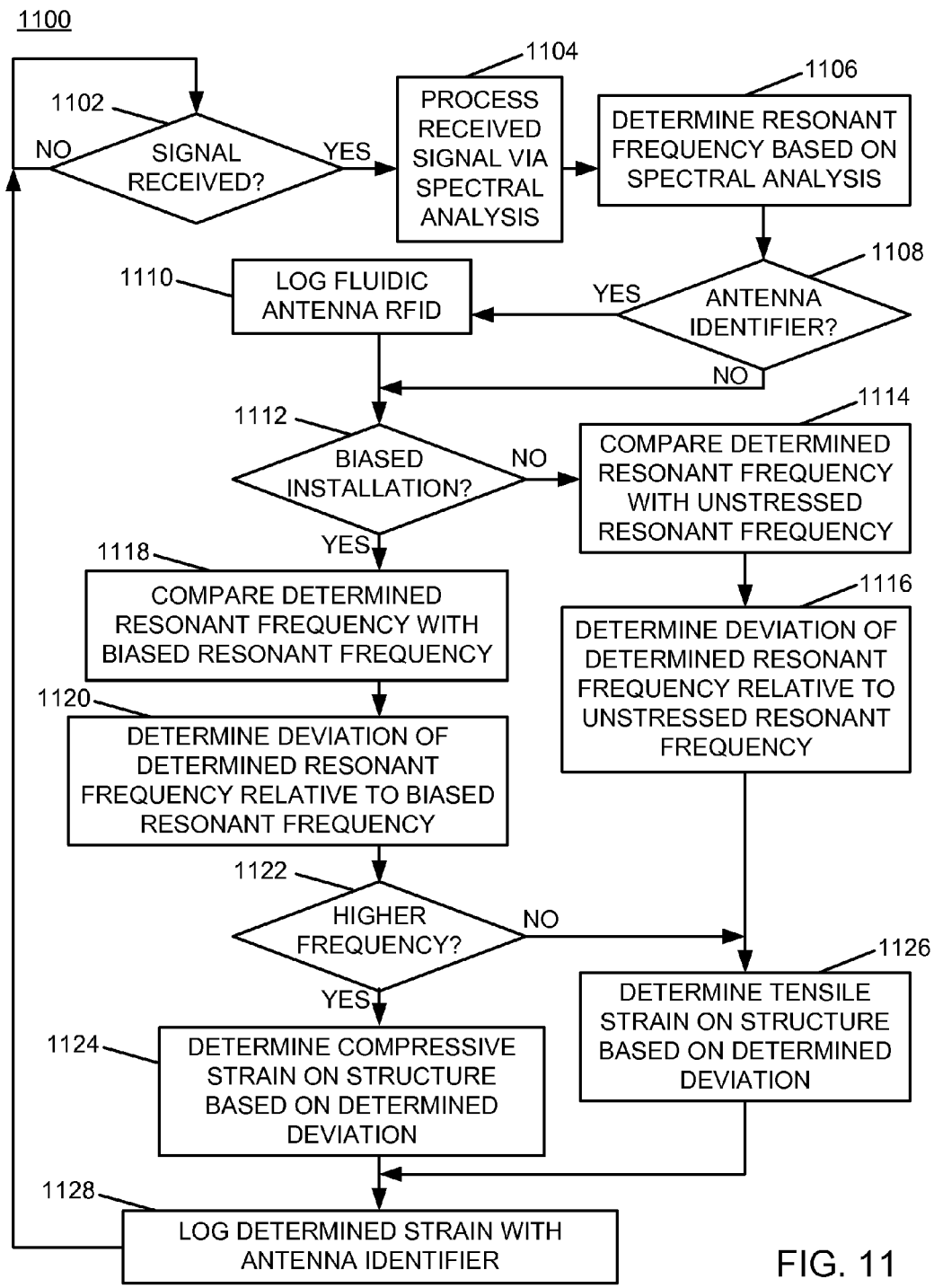
FIG. 11 is a flow chart of an example of an implementation of a process determining a strain on one or more structural elements using a set of reversibly deformable and mechanically tunable fluidic antennas and logging device identifiers associated with determined strain reading according to an embodiment of the present subject matter.

FIG. 11 is a flow chart of an example of an implementation of a process 1100 for determining a strain on one or more structural elements using a set of reversibly deformable and mechanically tunable fluidic antennas and logging device identifiers associated with determined strain reading. At decision point 1102, the process 1100 makes a determination as to whether a radio frequency signal has been received from a device transmitting via a fluidic antenna, such as the transmitter device 708 and the fluidic antenna 500. It should be noted that the process 1100 may iteratively process one or more fluidic antenna resonant frequency receptions associated with one or more fluidic antennas or changes in resonant frequency of a currently received fluidic antenna resonant frequency. It is further noted that the process 1100 may be implemented to concurrently process more than one fluidic antenna resonant frequency input as appropriate for a given implementation.

In response to determining that a radio frequency signal has been received at decision point 1102, the process 1100 processes the received signal via spectral analysis at block 1104. At block 1106, the process 1100 determines a resonant frequency of the radio frequency signal based upon the spectral analysis.

At decision point 1108, the process 1100 makes a determination as to whether a radio frequency identifier (RFID) is associated with the received radio frequency signal and fluidic antenna. In response to determining that an RFID is associated with the received radio frequency signal and fluidic antenna, the process 1100 logs the fluidic antenna RFID at block 1110. In response to completion of logging the fluidic antenna RFID or determining that no RFID is associated with the antenna at decision point 1108, the process 1100 makes a determination as to whether the fluidic antenna is mounted in a biased (e.g., elongated) installation at decision point 1112. As described above, a fluidic antenna may be mounted in a biased installation to allow detection of both expansion and contraction (e.g., tensile strain and compressive strain, respectively) of structural elements, such as structural elements of a building, bridge, fabric (e.g., a bandage), or other structural elements.

In response to determining that the fluidic antenna is not mounted in a biased installation, the process 1100 compares the determined resonant frequency with an unstressed resonant frequency of the fluidic antenna at block 1114. At block 1116, the process 1100 determines a deviation of the determined resonant frequency relative to the unstressed resonant frequency of the fluidic antenna. It is understood that for non-biased installations, a determined deviation in resonant frequency may include a change to a lower frequency as a result of elongation (e.g., stretching) of the fluidic antenna in response to tensile strain.

Returning to the description of decision point 1112, in response to determining that the fluidic antenna is mounted in a biased installation, the process 1100 compares the determined resonant frequency with the biased resonant frequency of the fluidic antenna at block 1118. At block 1120, the process 1100 determines a deviation of the determined resonant frequency relative to the biased resonant frequency of the fluidic antenna. It is understood that for biased installations, a determined deviation in resonant frequency may include a change to a higher frequency or a lower frequency as a result of a decrease in biased length or elongation (e.g., stretching) of the fluidic antenna in response to compressive strain or tensile strain, respectively.

At decision point 1122, the process 1100 makes a determination as to whether the deviation of the determined resonant frequency relative to the biased resonant frequency is a higher frequency or a lower frequency relative to the biased resonant frequency. In response to determining that the deviation of the determined resonant frequency relative to the biased resonant frequency is a higher frequency, the process 1100 determines the compressive strain on the structure in response to determining that the determined frequency comprises the higher frequency at block 1124. In response to determining that the deviation of the determined resonant frequency relative to the biased resonant frequency is a lower frequency at decision point 1122, or in response to completion of determining the deviation for the non-biased installation of a fluidic antenna at block 1116, the process 1100 determines the tensile strain on the structure in response to determining that the determined frequency comprises the lower frequency at block 1126. As described above with respect to block 1116, for non-biased installations, a determined deviation in resonant frequency may include a change to a lower frequency as a result of elongation (e.g., stretching) of the fluidic antenna in response to tensile strain.

At block 1128, the process 1100 logs the determined strain on the structural element along with the fluidic antenna RFID, if received. The process 1100 then returns to decision point 1102 to await receipt of a new signal or a change in resonant frequency of a currently received fluidic antenna resonant frequency.

As such, the process 1100 may receive and process resonant frequency information for one or more fluidic antennas. The process 1100 may determine compressive strain on a structure when a fluidic antenna is mounted in a biased installation, and may determine tensile strain for either biased or non-biased installations. The process 1100 may process one or multiple fluidic antennas to determine strain for one or multiple strain sensing locations, as appropriate for a given implementation, where RFID or other similar technology is employed to identify which of multiple strain sensing locations is being processed. Many other variations on the processing described are possible and all are considered within the scope of the present subject matter.

Based upon the subject matter described herein, fluidic antennas may be deformed reversibly (e.g., stretched, bent, rolled, wrapped, folded, etc.) without loss of electrical continuity. Furthermore, in response to such deformations, fluidic antennas may exhibit an equivalent spectral response before and after deformation. As such, fluidic antennas based upon the present subject matter may be considered reversibly deformable. Further, durability may be improved over conventional solid metal antennas due to a lack of hysteresis in response to deformation.

Relative to conventional copper antennas, the fluidic antennas as described herein provide several advantages. For example, the fluidic antennas may be considered reversibly deformable and durable. The elastomeric casing may define the mechanical properties of the fluidic antenna and the fluid metal flows in response to deformation to maintain electrical continuity. Additionally, the fluidic antennas may be considered mechanically tunable and sensitive to strain. Further, the liquid metal may form contacts with baluns at room temperature without soldering. As another example, the low modulus and low surface energy of elastomers such as PDMS allows the fluidic antennas to conform to numerous surfaces. Also, the fluidic antenna may self-heal in response to sharp cuts that leave sufficient elastomer intact to allow the elastomer to reform to its original shape. Additionally, the fabrication of the antenna by soft-lithography may allow many antennas to be produced from a single lithographic master. These advantages list a few of the advantages of the technology described herein.

As described above in association with FIG. 1 through FIG. 11, the example systems and processes provide manufacturing of reversibly deformable and mechanically tunable fluidic antennas, and examples of sensing and communicating information using such antennas. Many other variations and additional activities associated with reversibly deformable and mechanically tunable fluidic antennas are possible and all are considered within the scope of the present subject matter.

Those skilled in the art will recognize, upon consideration of the above teachings, that certain of the above examples are based upon use of a programmed processor. However, the invention is not limited to such example embodiments, since other embodiments could be implemented using hardware component equivalents such as special purpose hardware and/or dedicated processors. Similarly, general purpose computers, microprocessor based computers, micro-controllers, optical computers, analog computers, dedicated processors, application specific circuits and/or dedicated hard wired logic may be used to construct alternative equivalent embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:

receiving, via a receiving antenna of a computing device, a radio frequency signal transmitted via a fluidic antenna coupled to a structural element, where at least one liquid metal antenna element is formed within a material that defines an elastomeric mechanical property of the fluidic antenna and where spectral transmission characteristics of the fluidic antenna change in response to changes in shape of the fluidic antenna;

determining a resonant frequency of the radio frequency signal; and determining a strain on the structural element based upon the determined resonant frequency of the radio frequency signal.

2. The method of claim 1, where determining the resonant frequency of the radio frequency signal comprises:

processing the radio frequency signal via spectral analysis; and determining the resonant frequency of the radio frequency signal based upon output of the spectral analysis.

3. The method of claim 1, where determining the strain on the structural element based upon the determined resonant frequency of the radio frequency signal comprises:

comparing the determined resonant frequency with an unstrained resonant frequency of the fluidic antenna;

determining a deviation of the determined resonant frequency relative to the unstrained resonant frequency of the fluidic antenna; and determining the strain on the structural element based upon the determined deviation of the determined resonant frequency relative to the unstrained resonant frequency of the fluidic antenna.

4. The method of claim 1, where the fluidic antenna is coupled to the structural element with a biased elastomeric strain resulting in a biased resonant frequency, and where determining the strain on the structural element based upon the determined resonant frequency comprises determining one of a compressive strain and a tensile strain on the structural element based upon the determined resonant frequency.

5. The method of claim 4, where determining the one of the compressive strain and the tensile strain on the structural element based upon the determined resonant frequency comprises:

comparing the determined resonant frequency with the biased resonant frequency of the fluidic antenna;

determining a deviation of the determined resonant frequency relative to the biased resonant frequency of the fluidic antenna;

determining whether the deviation of the determined resonant frequency relative to the biased resonant frequency comprises one of a higher frequency and a lower frequency relative to the biased resonant frequency;

determining the compressive strain on the structural element in response to determining that the determined resonant frequency comprises the higher frequency; and determining the tensile strain on the structural element in response to determining that the determined resonant frequency comprises the lower frequency.

6. The method of claim 1, further comprising:
determining a radio frequency identifier (RFID) associated with a device that transmitted the radio frequency signal;
logging the RFID associated with the device that transmitted the radio frequency signal; and
logging the determined strain on the structural element.

\* \* \* \* \*